United States Patent
Ellis et al.

(10) Patent No.: US 6,678,458 B2
(45) Date of Patent: Jan. 13, 2004

(54) SYSTEM AND METHOD FOR PRECISE POSITIONING OF MICROCOMPONENTS

(75) Inventors: Matthew D. Ellis, Allen, TX (US); George D. Skidmore, Plano, TX (US)

(73) Assignee: Zynex Corporation, Richardson, TX (US)

( * ) Notice: Subject to any disclaimer, the term of this patent is extended or adjusted under 35 U.S.C. 154(b) by 74 days.

(21) Appl. No.: 09/932,489

(22) Filed: Aug. 17, 2001

(65) Prior Publication Data

US 2003/0219220 A1 Nov. 27, 2003

(51) Int. Cl.$^7$ ................................................ G02B 6/00
(52) U.S. Cl. ........................................................ 385/137
(58) Field of Search .......................... 310/307; 385/137, 385/90, 88, 89, 91, 92; 359/871, 223, 224

(56) References Cited

U.S. PATENT DOCUMENTS

| | | |
|---|---|---|
| 4,740,410 A | 4/1988 | Muller et al. |
| 5,602,955 A | 2/1997 | Haake |
| 5,645,684 A | 7/1997 | Keller |
| 5,660,680 A | 8/1997 | Keller |
| 5,692,086 A | 11/1997 | Beranek et al. |
| 5,745,624 A | 4/1998 | Chan et al. |
| 5,962,949 A * | 10/1999 | Dhuler et al. ............... 310/307 |
| 6,164,837 A | 12/2000 | Haake et al. |

OTHER PUBLICATIONS

Automated Assembly of Flip–Up Micromirrors, by J. Robert Reid et al., Transducers '97, 1997 Int'l. Conference on Solid–State Sensors & Actuators, Chicago, Jun. 16–19, 1997.

Microactuated Self–Assembling of 3D Polysilicon Structures with Reshaping Technology. By Y. Fukuta et al., IEEE 1997, 0–7803–3744–1/97.

A Reshaping Technology with Joule Heat for Three Dimensional Silicon Structures, by Yamato Fukuta et al., Transducers '95, The 8$^{th}$ Int'l Conference on Solid–State Sensors and Actuators, Stockholm, Sweden, Jun. 25–29, 1995.

Reshaping of Single–Crystal Silicon Microstructures, by Eui–Hyeok Yang et al. IIS, The Univ. of Tokyo 702201, accepted for publication Dec. 14, 1998.

Thermal microactuators for surface–micromachining processes, by John H. Comtois et al. SPIE vol. 2642, 0–8194–2008–5/95.

Cyclic Fatigue Testing of Surface–Micromachined Thermal Actuators, by Robert A. Conant et al., Dept. of EECS, Univ. of California, Berkeley.

* cited by examiner

*Primary Examiner*—Euncha Cherry
(74) *Attorney, Agent, or Firm*—Haynes and Boone, LLP

(57) ABSTRACT

A system and method are disclosed that enable precise positioning of microcomponents. According to one embodiment, a system and method for positioning a microcomponent are disclosed, wherein a microcomponent is received into a microcomponent positioning device. A target position for the microcomponent may then be determined, and at least a portion of the microcomponent positioning device is controllably deformed to accurately fix, at least temporarily, the position of the microcomponent at the target position. In one embodiment, microactuators that are operable to move the microcomponent are controllably deformed to fix the position of the microcomponent at the target position. In another embodiment, support beams that support a microcomponent holder are controllably deformed to fix the position of the microcomponent at the target position.

70 Claims, 7 Drawing Sheets

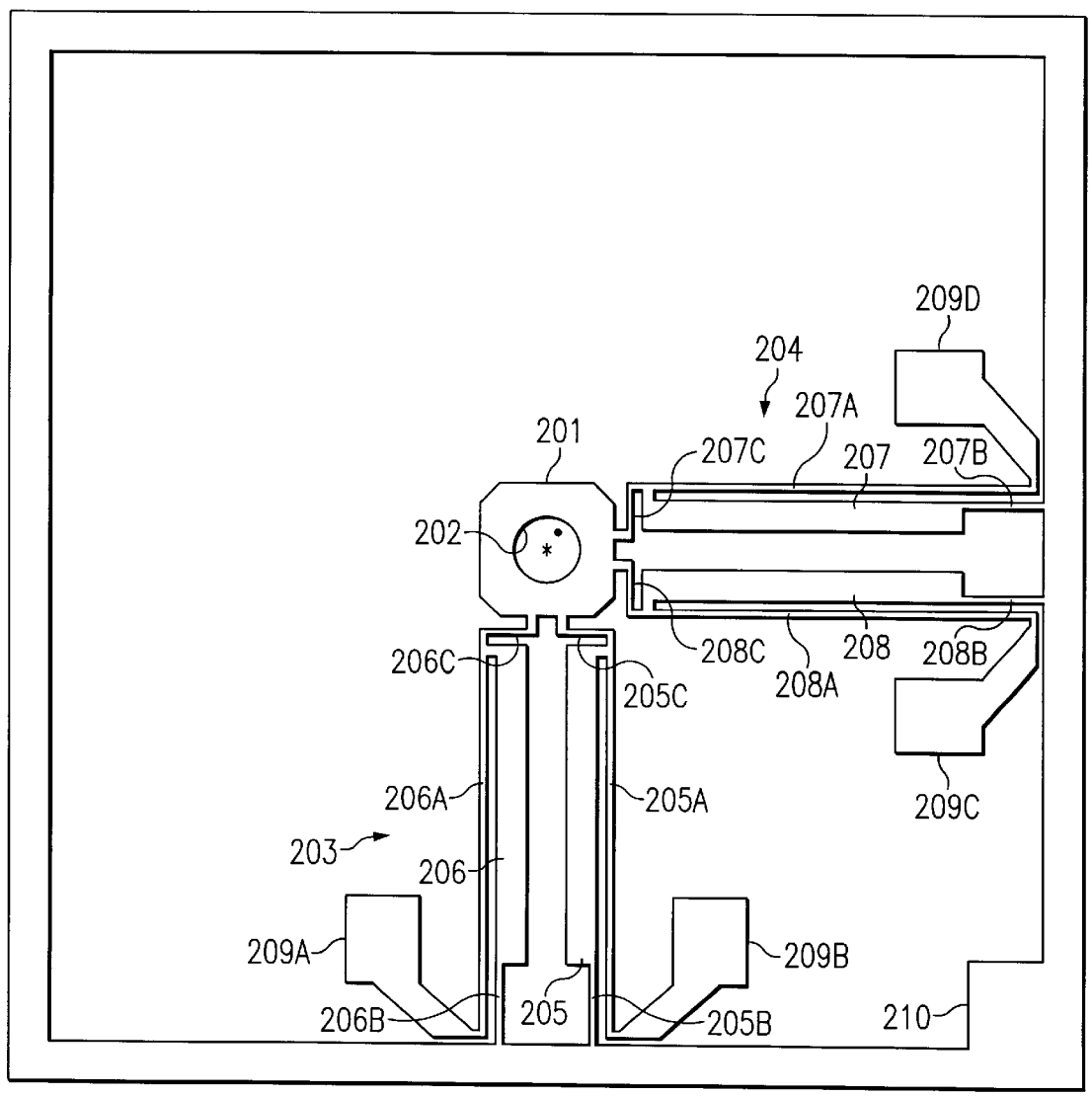
FIG. 2
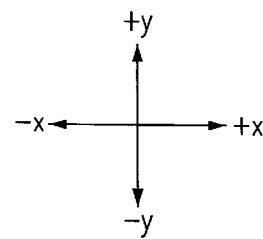

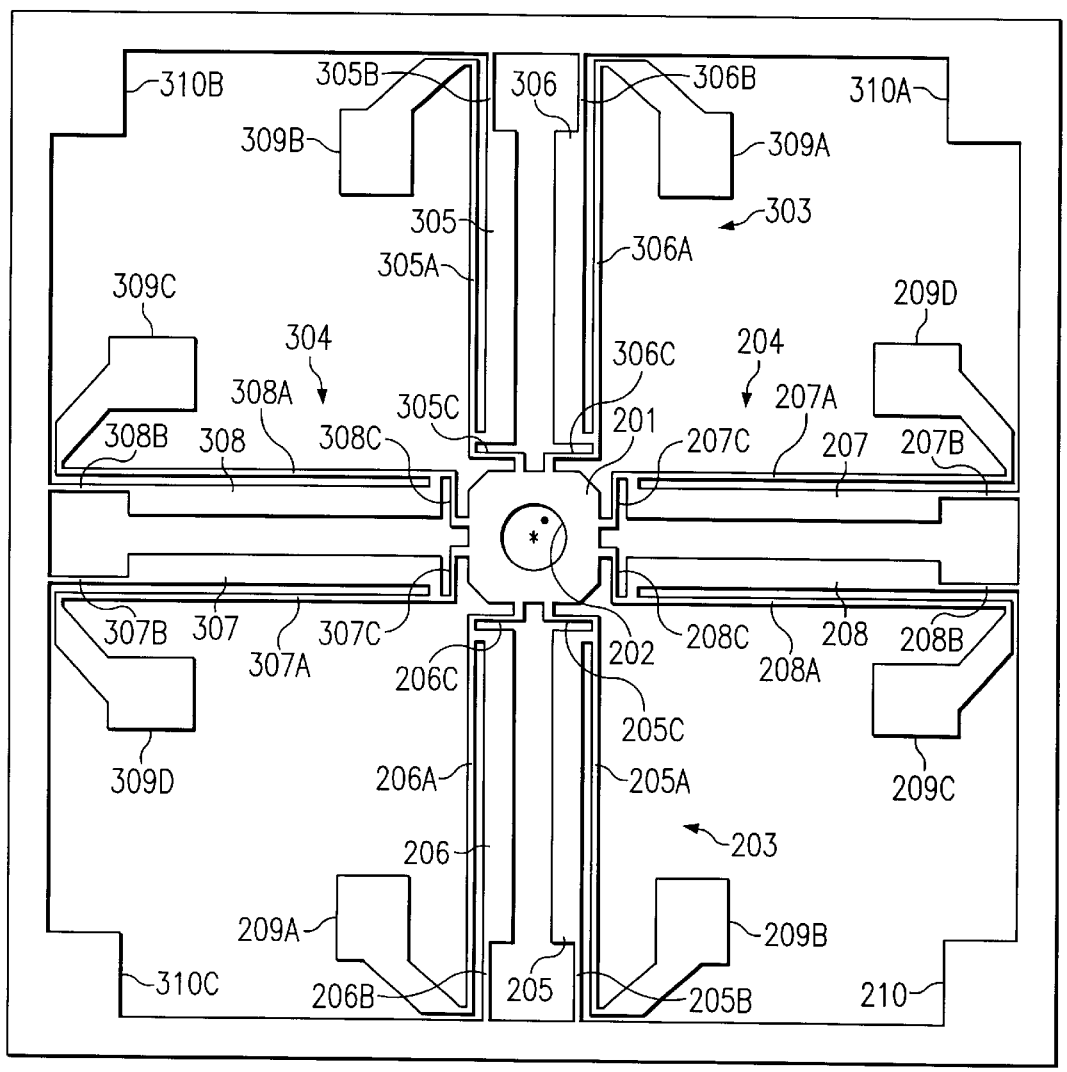
FIG. 3
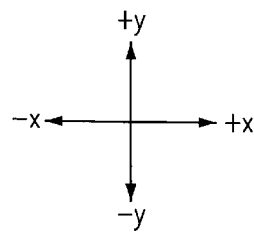

SYSTEM AND METHOD FOR PRECISE POSITIONING OF MICROCOMPONENTS

CROSS-REFERENCE TO RELATED APPLICATIONS

This application is related to and commonly assigned U.S. patent application Ser. No. 09/569,330 entitled "METHOD AND SYSTEM FOR SELF-REPLICATING MANUFACTURING STATIONS" filed May 11, 2000, 09/570,170 entitled "SYSTEM AND METHOD FOR COUPLING MICROCOMPONENTS" filed May 11, 2000, 09/616,500 entitled "SYSTEM AND METHOD FOR CONSTRAINING TOTALLY RELEASED MICROCOMPONENTS" filed Jul. 14, 2000, and 09/643,011 entitled "SYSTEM AND METHOD FOR COUPLING MICROCOMPONENTS UTILIZING A PRESSURE FITTING RECEPTACLE" filed Aug. 21, 2000; the disclosures of which are hereby incorporated herein by reference.

BACKGROUND OF THE INVENTION

1. Technical Field

The present invention is related to positioning of microcomponents, and more particularly to a system and method for fixing the position of a microcomponent such that it is precisely aligned with a target position.

2. Background

Extraordinary advances are being made in micromechanical devices and microelectronic devices. Further, advances are being made in MicroElectroMechanical ("MEM") devices, which comprise integrated micromechanical and microelectronic devices. The term "microcomponent" will be used herein generically to encompass microelectronic components, micromechanical components, as well as MEMs components. The advances in microcomponent technology have resulted in an increasing number of microcomponent applications. Accordingly, a need often arises for precise positioning of microcomponent devices. For example, it is often desirable to position a microcomponent in alignment with a target position. For instance, for certain applications it may be desirable to align a microcomponent with another device. Because of the small size of microcomponents, they often require very precise positioning (e.g., precise alignment with another device). For example, in some cases a misalignment of only a few microns may be unacceptable. In fact, in some cases the size of the microcomponent being aligned may be only a few microns. Also, microcomponents present particular difficulty in handling and positioning operations.

Microcomponents are commonly implemented in the field of optoelectronics. Generally, when coupling optoelectronic components, alignment is very important. That is, alignment of optoelectronic components is often critical for proper operation of an optoelectronic device. A relatively slight misalignment of optical components may drastically alter an optical device's performance. For example, accurate alignment of components is often important for ensuring proper propagation of an optical signal to/from/within an optoelectronic device. For instance, optoelectronic modules, such as optoelectronic receivers and optoelectronic transmitters commonly require proper alignment of microcomponents therein for proper operation. In general, proper alignment is desired to minimize the amount of attenuation within such optoelectronic devices.

One microcomponent that often requires proper alignment is an optical fiber. For example, in an optoelectronic receiver, a fiber is aligned with an optical detector, typically a PIN photodiode. Very large fibers may have light-guiding cores with a diameter of approximately 1 millimeter (mm) or 1000 microns ($\mu$m), but such fibers are rarely used in communications. Standard glass communication fibers have cladding diameter of 125 $\mu$m and light-guiding cores with diameter of approximately 8 to 62.6 $\mu$m. Proper alignment of the end of the optical fiber (which may be referred to as the "fiber pigtail") with the optical detector is important to ensure that a light signal is properly received by the optical detector. Similarly, in an optoelectronic transmitter, an optical fiber is aligned with a light source, such as a light-emitting diode (LED) or laser diode. Proper alignment of the end of the optical fiber with the light source is important to ensure that a light signal is properly communicated from the light source to the optical fiber.

The difficulty in achieving proper alignment of optical fiber is often increased because of variances in the size of fiber core diameters. For example, typical commercial graded-index fiber commonly specify a 50 $\mu$m nominal fiber core diameter that may vary within a tolerance of ±3 $\mu$m. Also, alignment/positioning of the light-guiding core within the sleeve of a fiber optic cable often varies (i.e., the core is not always centered within the sleeve), thereby further increasing the difficulty of properly designing a fiber with another optoelectronic device.

Various techniques have been developed for handling and positioning microcomponents, such as optical fibers. According to one technique, a high-precision, external robot is utilized to align microcomponents within devices. However, such external robots are generally very expensive. Additionally, external robots typically perform microcomponent alignment in a serial manner, thereby increasing the amount of time required for manufacturing microcomponent devices. That is, such robots typically perform alignment for one component at a time, thereby requiring a serial process for assembling microcomponents utilizing such a robot.

According to another technique, microactuators, such as electrothermal actuators, may be utilized to align microcomponents, such as optical fibers. For example, microactuators may be integrated within a device to align microcomponents within the device. Accordingly, use of such microactuators may avoid the cost of the above-described external robot. Also, if implemented within a device, the microactuators may enable parallel alignment of microcomponents. That is, multiple devices may have alignment operations performed by their respective microactuators in parallel, which may reduce the amount of time required in manufacturing the devices. Examples of techniques using microactuators integrated within a device to perform alignment of an optical fiber are disclosed in U.S. Pat. Nos. 6,164,837 and 5,602,955.

Once a desired position is obtained for a microcomponent (e.g., alignment with another device) using either of the above techniques, such microcomponent may have its position fixed in some manner such that it maintains the desired position. Various techniques have been developed for fixing the position of microcomponents. According to one technique, an epoxy may be used to fix the position of a microcomponent. In another technique a low melting point bonding material, such as solder, may be used to fix the position of a microcomponent. Exemplary techniques that use solder to fix the position of an optical fiber are disclosed in U.S. Pat. No. 6,164,837, U.S. Pat. No. 5,692,086, and U.S. Pat. No. 5,745,624.

According to another technique, an "active" alignment device may be utilized to fix the position of a microcomponent. Such an alignment device is "active" in the sense that electrical power has to be maintained in order to fix the alignment of a microcomponent. For example, in certain implementations that use microactuators integrated within a device to perform alignment of microcomponents, power to such microactuators must be maintained in order to maintain (or fix) the position of the microcomponents being aligned.

BRIEF SUMMARY OF THE INVENTION

In view of the above, traditional techniques for positioning microcomponents are problematic. First, as described above, high-precision external robots may be utilized for accurately positioning microcomponents, but such robots are very expensive and do not enable parallel manufacturing of devices. Microcomponent devices have been developed in the prior art for positioning microcomponents, which are generally less expensive than the external robots and may enable parallel manufacturing of devices (e.g., may be integrated within devices to perform microcomponent positioning in their respective devices in parallel). Many such microcomponent positioning devices are active in the sense that require continuous power in order to maintain a desired positioning of a microcomponent. Such an active device is generally undesirable. For example, it is generally undesirable to require that power be maintained for positioning a microcomponent within a device that is deployed in the field. Other techniques require use of epoxy or solder to fix the position of a microcomponent. The use of such epoxy or solder increases the complexity of the fixing process, delays the manufacturing time, and may result in inaccurate positioning (because of shifting in the curing/cooling period). Also, certain bonding techniques (e.g., using certain epoxies) may not maintain a microcomponent's position over a wide range of environmental conditions (e.g., may fail when exposed to very high and/or cold temperatures, as may be experienced by devices deployed in the field). Thus, a method and system are desired that enable accurate positioning of a microcomponent without requiring that power be maintained for maintaining such positioning and without requiring use of epoxy/solder for fixing the microcomponent's position.

The present invention is directed to a system and method that enable precise positioning of microcomponents. According to one embodiment, a system and method for positioning a microcomponent are disclosed, wherein a microcomponent is received into a microcomponent positioning device. A target position for the microcomponent may then be determined, and at least a portion of the microcomponent positioning device is controllably deformed to accurately fix, at least temporarily, the position of the microcomponent at the target position.

In certain embodiments, at least a portion of the microcomponent positioning device is controllably deformed by heating such portion to a sufficiently high temperature to make it amenable to alteration of its shape. Such heating may comprise electrothermal heating or laser heating, as examples. For instance, according to one implementation, one or more microactuators may be included within the microcomponent positioning device and may be operable to move the microcomponent to various positions. For example, in one implementation microactuators are arranged to enable movement of the microcomponent along two orthogonal axes, and in another implementation microactuators are arranged to enable movement of the microcomponent along three orthogonal axes. In one embodiment, such microactuators may be utilized to first determine a desired target position for a microcomponent, and thereafter, the microactuators may be controllably deformed to fix, at least temporarily, the position of the microcomponent to the target position. For instance, such microactuators may be electrothermally deformed to accurately fix, at least temporarily, the position of the microcomponent to the target position.

In another embodiment, support beams are included for supporting a microcomponent holder, which holds the microcomponent to be positioned. In such embodiment, the support beams may be controllably deformed to fix, at least temporarily, the position of the microcomponent to the target position. For example, the support beams may be heated (e.g., electrothermally heated) to a sufficient temperature such that they become amenable to alteration of their shape, and microactuators may be used to move the microcomponent holder in a manner to determine a desired target position for the microcomponent being held by such microcomponent holder. Once the target position is determined, the microactuators may apply a force to maintain the microcomponent at such target position, and the support beams may be allowed to cool/harden. Thereafter, the microactuators may be deactivated (powered-off), and the deformed support beams maintain the microcomponent holder such that the microcomponent is at the target position.

Accordingly, embodiments of the present invention provide a system and method for accurately positioning microcomponents. Further, according to embodiments of the present invention, the position of a microcomponent may be fixed, at least temporarily, to a target position without requiring power for fixing such position. Additionally, according to embodiments of the present invention, the position of a microcomponent may be fixed, at least temporarily, to a target position without requiring use of epoxy or solder for fixing such position.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 2 shows another exemplary implementation of a positioning device in accordance with a first embodiment of the present invention;

FIG. 3 shows still another exemplary implementation of a positioning device in accordance with a first embodiment of the present invention;

DETAILED DESCRIPTION OF THE INVENTION

Figure 1:
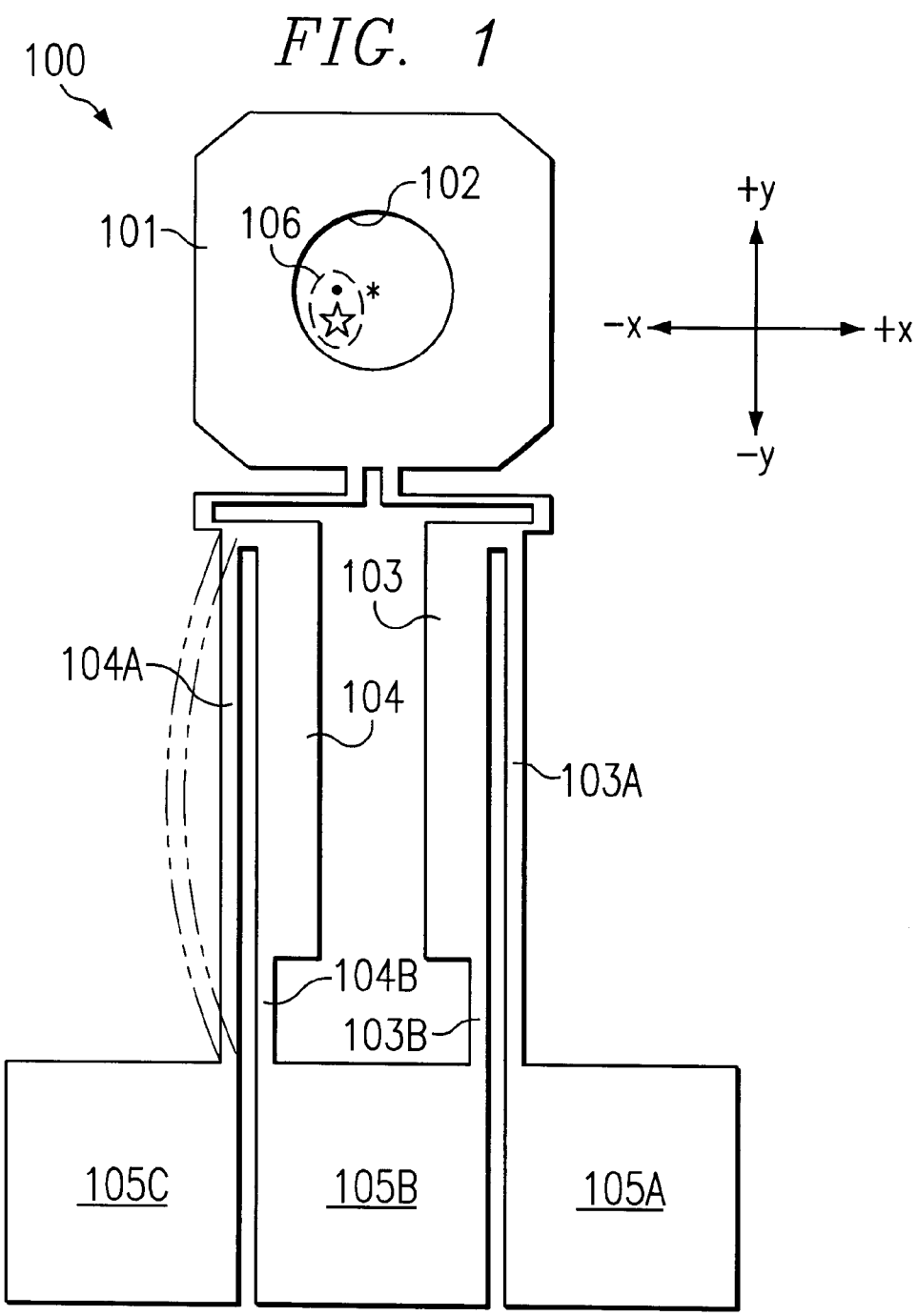
FIG. 1 shows an exemplary implementation of a positioning device in accordance with a first embodiment of the present invention.

Turning to FIG. 1, an exemplary implementation of one embodiment of the present invention is shown. Specifically, microcomponent positioning device 100 (which may be referred to as an "align-and-fix device") is shown. Positioning device 100 includes a microcomponent holder 101 (which may be referred to herein as holding compartment 101) to hold a microcomponent to be positioned. For example, microcomponent holder 101 may hold an optical fiber, other optical component, or any other microcomponent. Microcomponent holder 101 includes aperture 102, into which a microcomponent may be inserted. Positioning device 100 further includes microactuators 103 and 104 (e.g., electrothermal actuators), and electrical contacts 105A, 105B and 105C for powering actuators 103 and 104. As shown, actuator 103 includes hot arm 103A and flexure 103B, and actuator 104 includes hot arm 104A and flexure 104B. According to at least one embodiment, actuators 103 and 104 (or at least hot arms 103A and 104A) may be made of a thermally deformable material, such as conductive plastic, silicon, polysilicon, or nickel. In the example of FIG. 1, hot arms 103A and 104A are made of a suitable material that enables them to be electrothermally deformed.

As an example of operation of device 100, suppose a user desires to precisely position a fiber optic cable (e.g., to align the fiber optic cable with a receiver or transmitter); the fiber may be held by holder 101. For instance, the fiber may be inserted into aperture 102 and secured therein (e.g., via epoxy or by clamping holder 101 against the fiber). Once the fiber is securely held by holder 101, voltage (which may be referred to as "operational voltage" herein) may be applied to electrical connections 105 to cause actuator 103 or 104 to move holder 101 (and therefore move the fiber being held by holder 101). For instance, the fiber may be moved to the left and to the right (along the x axis in FIG. 1) until a desired position is determined (e.g., a position that provides a desired alignment of the fiber with another device, such as an optical detector or a light source). A feedback technique may be used to determine a target position, such as described further with FIG. 8 hereafter. Once the target position is determined, actuators 103 and/or 104 may be controllably deformed to fix the position of the fiber to the target position. More specifically, hot arms 103A and/or 104B may be controllably deformed to bring the position of the fiber into alignment with the target position.

For example, suppose the fiber is positioned in the center of aperture 102, as indicated by an asterisk (*). Further suppose that a desired target position for the fiber is determined to be located in the −X direction from the fiber's initial position (*); such target position being indicated in FIG. 1 by a dot (●). It may be desirable to have the fiber's position fixed at the target position (●). In this embodiment, voltage pulses (which may be referred to as "deforming" voltage pulses (●) to distinguish them from voltage used for normal operation of the actuators) may be applied between electrical pads 105C and 105B to electrothermally heat hot arm 104A of actuator 104 in a manner to controllably deform such hot arm 104A. More specifically, in applying the deforming voltage to deform hot arm 104A, current may be run from electrical pad 105C up hot arm 104A and down to electrical pad 105B, which causes hot arm 104A to electrothermally heat and deform. While the deforming voltage is applied, actuator 104 may cause holder 101 to move in the +X direction. However, when power is turned off, hot arm 104A may be slightly deformed (e.g., bent) such that the power-off position of holder 101 is moved in the −X direction.

In certain implementations, the deformation of hot arm 104A may be performed iteratively, wherein the procedure of applying the deforming voltage to deform hot arm 104A may be performed in iterative sessions to cause the power-off position of holder 101 to move closer and closer to the target position (●) for the fiber. In other implementations, current may be steadily applied to cause the desired deformation of hot arm 104A. In either case, the actual amount of deformation depends on the temperature to which the material of hot arm 104A is raised, the strain the material is under, and the amount of time the material is under such conditions. As an example, a relatively short duration (e.g., approximately 500–1000 microseconds) 10-volt pulse may deform the microactuator less than 250 nanometers. A longer duration (e.g., approximately 1–2 seconds) 6–8 volt pulse can deform the actuator approximately 1 to 2 microns. Lower voltages (e.g., approximately 4–6 volts) applied over the same amount of time (e.g., approximately 1–2 seconds) will deform the actuator approximately 1 micron or less. Essentially, with low enough voltages, the deformation rate is slow enough that such deformation may be visually monitored.

By controlling the deformation conditions (e.g., the amount of voltage applied and amount of time such voltage is applied), the amount of deformation of a microactuator may be accurately controlled. For instance, the above properties known for a particular microactuator may be used to control its deformation. For example, assuming that the above deformation properties are known for a microactuator, if it were desirable to deform (e.g., bend) such microactuator to fix the end of such microactuator at a position 1 micron from its original position, such deformation properties may be used to control its deformation in a desired manner. As an example, a 10-volt pulse applied for 500 microseconds may be used in an iterative fashion (with deformation of approximately 250 nanometers being achieved at each iteration) until the desired 1 micron deformation is achieved. As another example, 6 volts may be applied for 1 second to achieve approximately the desired 1 micron deformation. Deformation properties may be derived for any microactuator (e.g., through empirical methods), and such deformation properties may be used to accurately control the amount of deformation of a microactuator.

Electrothermal deformation of actuators is well known in the art and is generally referred to as "backbending". For example, "backbending" of microactuators has been recognized by Comtois, et al. (See Comtois J. H., Bright V. M., and Phipps M. W., "Thermal Microactuators for Surface Micromachining Processes," Proceedings of the SPIE 2642 pp 10–21, the disclosure of which is hereby incorporated herein by reference) and Conant et al. (See Conant R. A., Muller R. S., "Cyclic Fatigue Testing of Surface-Micromachined Thermal Actuators," 1998 *ASME International Mechanical Engineering Congress and Exposition* 66 pp 273–277, the disclosure of which is hereby incorporated herein by reference). While backbending of microactuators has been recognized in the past, accurately controlling such backbending for achieving a useful purpose has not been taught.

Returning to the exemplary implementation of FIG. 1, once the deformation process is complete, hot arm 104A may be slightly bent (or bowed), as shown in dashed lines in FIG. 1. By accurately controlling such deformation (e.g., by controlling the amplitude of voltage, the number of voltage pulses, and/or the length of time voltage is applied to hot arm 104A), the power-off position of holder 101 (and the fiber being held thereby) may be fixed with great precision.

In performing the deformation process for deforming hot arm 104A, such process may overshoot the target position. In the exemplary implementation of FIG. 1, hot arm 103A may be controllably deformed in a similar manner as described above for hot arm 104A in order to adjust the power-off position of holder 101 back toward the +X direction. Thus, actuators 103 and 104 may have offsetting deformation. That is, deformation of one of actuators 103 and 104 may, at least partially, offset (or cancel out) deformation of the other of actuators 103 and 104.

In view of the above, the exemplary implementation of FIG. 1 enables movement of holder 101 in two opposite directions (i.e., the positive and negative X directions), and the range of movement according to at least one implementation may be approximately 10 μm. Of course, other ranges of motion may be implemented. In the implementation of FIG. 1, the deformation may result in relatively slight movement of holder 101 in the Y direction. Although, generally such movement in the Y direction is fairly small (e.g., approximately 500 nanometers), which may provide sufficiently precise positioning of the microcomponent held by holder 101 (e.g., a fiber) in many applications. Thus, for example, the actual resulting position of the fiber in the example of FIG. 1 may be as indicated by a star (☆) in FIG. 1, which is slightly off of the target position (●). Specifically, the resulting position is offset from the target position slightly in the −Y direction because of the deformation (e.g., bending) of hot arm 104A.

Exemplary positioning device 100 shown in FIG. 1 may provide sufficient positioning of a microcomponent in certain applications. For example, suppose positioning device 100 is utilized in an optoelectronic transmitter to align a fiber with a light source (e.g., a LED or laser diode). Often, accurate positional alignment along the X axis may be desired, with relatively less concern for the accurateness of positioning along the Y axis. For instance, the light source with which the fiber is being aligned may produce a light beam having an oblong shape, which is shown as light beam 106 in the example of FIG. 1. Thus, while the resulting position (☆) is not exactly aligned with the target position (●), the resulting position is still aligned in a manner to enable proper reception of light beam 106. That is, positioning device 100 enables accurate alignment along the X axis, and the slight misalignment along the Y axis in this example is acceptable. Thus, exemplary positioning device 100 may provide a suitable device for aligning and fixing the position of an optical fiber in this exemplary scenario. Of course, other applications may exist in which the operational capability of positioning device 100 may be adequate.

Turning now to FIG. 2, an exemplary implementation of another embodiment of the present invention is shown. In the embodiment of FIG. 2, positioning device 200 is shown, which allows for movement in both the X and Y directions. Essentially, exemplary positioning device 200 of FIG. 2 comprises two of the actuator arrangements described above in FIG. 1 arranged at 90 degrees relative to each other. More specifically, positioning device 200 includes microcomponent holder 201 (or "holding compartment" 201) that is operable to hold a microcomponent to be positioned in the manner described above for holder 101 of FIG. 1. As with microcomponent holder 101 of FIG. 1, microcomponent holder 201 may hold an optical fiber, other optical component, or any other microcomponent to be positioned. In this implementation, microcomponent holder 201 includes aperture 202, in which a microcomponent may be inserted. Positioning device 200 further includes actuator pair 203 operable to provide movement of holder 201 in the ±X direction, and actuator pair 204 operable to provide movement of holder 201 in the ±Y direction. As shown, actuator pair 203 includes actuators 205 and 206, Actuator 205 includes hot arm 205A and flexure 205B, and actuator 206 includes hot arm 206A and flexure 206B. As further shown, actuator pair 204 includes actuators 207 and 208. Actuator 207 includes hot arm 207A and flexure 207B, and actuator 208 includes hot arm 208A and flexure 208B. Additionally, electrical contacts 209A–209D and 210 are included to power actuators 205–208. In this example, flexures 205C and 206C couple actuators 205 and 206, respectively, to holder 201, and flexures 207C and 208C couple actuators 207 and 208, respectively, to holder 201.

As an example of operation of device 200, suppose again that a user desires to precisely position an optical fiber (e.g., to align the optical fiber with a receiver or transmitter); the fiber may be held by holder 201 in any suitable manner, such as those described above in conjunction with holder 101. For example, the fiber may be epoxied in aperture 202 of holder 201. Voltage may then be applied to at least one of electrical connections 209A–209D to trigger at least one of actuators 205–208 to move holder 201 (and therefore move the fiber being held by holder 201). As one or more of actuators 205–208 are activated, flexures 205C–208C flex to enable holder 201 to move in a desired direction responsive to such actuators. For instance, flexures 205C–206C flex to enable holder 201 to move in the ±Y direction responsive to actuators 207–208, and flexures 207C–208C flex to enable holder 201 to move in the ±X direction responsive to actuators 205–206.

Actuators 205–208 may initially be used to move holder 201 in a manner to determine a desired target position for the fiber. For instance, the fiber may be moved in the ±X and/or the ±Y directions until a desired target position is determined (e.g., a position that provides a desired alignment of the fiber with another device, such as an optical detector or a light source). In certain implementations, a feedback technique may be used to determine the target position. Holder 201 may be moved in a manner to effectively scan in the X and Y directions to search for the target position (e.g., the optimal position for the microcomponent being held by holder 201). Such scanning may, in certain implementations, be performed according to any suitable search algorithm now known or later developed, including without limitation well known hill climbing algorithms. Such a search algorithm may be used to efficiently determine the target position.

Once the target position is determined, at least one of actuators 205–208 may be controllably deformed to fix the position of the fiber to the target position. That is, at least one of actuators 205–208 may be controllably deformed to bring the position of the fiber into alignment with the target position. For example, suppose, the fiber is positioned in the center of aperture 202, as indicated by an asterisk (*). Further suppose that a desired target position for the fiber is determined to be located in the +X and +Y direction from the fiber's initial position (*); such target position being indicated in FIG. 2 by a dot (●). It may be desirable to have the fiber's position fixed at the target position (●).

In this embodiment, voltage pulses (or "deforming voltage pulses") may be applied between electrical pads 209B and 210 to electrothermally heat hot arm 205A of actuator 205, and voltage pulses may be applied between electrical pads 209D and 210 to electrothermally heat hot arm 207A of actuator 207. Such deforming voltage pulses may be applied in a manner to controllably deform hot arms 205A and 207A. While the deforming voltage is applied to actuator 205, it may cause holder 201 to move in the −X direction. However, when power is turned off, hot arm 205A may be slightly deformed (e.g., bent or bowed) such that the power-off position of holder 201 is moved in the +X direction. Similarly, while the deforming voltage is applied to actuator 207, it may cause holder 201 to move in the −Y direction. However, when power is turned off, hot arm 207A may be slightly deformed (e.g., bent or bowed) such that the power-off position of holder 201 is moved in the +Y direction.

In certain implementations, the deformation of hot arms 205A and 207A may be performed iteratively, wherein the procedure of applying voltage to deform hot arms 205A and 207A may be performed in iterative sessions to cause the power-off position of holder 201 to move closer and closer to the target position (●) for the fiber. In certain implementations, continuous deformation may be utilized, in which a specific voltage may be steadily applied for a period of time to gradually deform the hot arm. [In certain implementations, the amount of movement desired in each direction may be determined, and the appropriate number of voltage pulses (and/or the amplitude and/or the length of each pulse) to be applied may be determined. For instance, a curve fitting algorithm may be used to determine the type of deforming voltage (e.g., the number of pulses, the voltage amplitude, and/or the length of time voltage is to be applied) to be applied that will likely position holder 201 at the target position. Alternatively, a lookup table or database may include information detailing the type of deforming voltage to apply to result in the desired amount of movement in the X and Y directions. Of course, as described more fully with FIG. 8, a feedback system may be utilized to aid in accurately positioning holder 201.

Once the deformation process is complete, hot arms 205A may be slightly bent (or bowed). By accurately controlling such deformation (e.g., by controlling the deforming voltage applied to hot arms 205A and 207A), the power-off position of holder 201 (and the fiber being held thereby) may be fixed with great precision. It should be understood that the resulting position of holder 201 may be considered permanently fixed, as the actuators are deformed to maintain such position unless and until further action is taken to alter the position. Of course, the actuators may, in certain implementations, be controllably deformed at a later time to alter the position of the microcomponent being held by holder 201, which may enable adjustment to be made to devices after they are deployed in the field.

In performing the deformation process, such process may overshoot the target position in either the X, Y, or both directions. In the exemplary implementation of FIG. 2, hot arm 206A may be controllably deformed in a similar manner as described above for hot arm 205A in order to adjust the power-off position of holder 201 back toward the −X direction, and hot arm 208A may be controllably deformed in a similar manner as described above for hot arm 207A in order to adjust the power-off position of holder 201 back toward the −Y direction. Thus, actuators 205 and 206 of pair 203 may have offsetting deformation, and actuators 207 and 208 of pair 204 may have offsetting deformation with respect to the resulting effect on the position of holder 201. That is, deformation of one of actuators 205 and 206 may, at least partially, offset (or cancel out) deformation of the other of such actuators 205 and 206, and deformation of one of actuators 207 and 208 may, at least partially, offset (or cancel out) deformation of the other of such actuators 207 and 208.

In view of the above, the exemplary implementation of FIG. 2 enables movement of holder 201 in two opposite directions along each of two orthogonal axes (i.e., in the ±X directions and the ±Y directions), and the range of movement along each of the two axes (X and Y axes) according to at least one implementation may be approximately 10 μm. As with the implementation of FIG. 1, the actuator deformation to alter the position of holder 201 along one axis (e.g., the X axis) may result in slight movement of the position of holder 201 along the other axis (e.g., the Y axis). For instance, in the above example, when hot arm 205A is deformed to move the position of holder 201 in the +X direction, the bending of actuator 205 may cause slight movement of holder 201 in the −Y direction. Similarly, when hot arm 207A is deformed to move the position of holder 201 in the +Y direction, the bending of actuator 207 may cause slight movement of holder 201 in the +X direction. Although, generally such residual movement along the orthogonal axis is fairly small (e.g., approximately 500 nanometers), which may provide sufficiently precise positioning of the microcomponent held by holder 202 (e.g., a fiber) in many applications. Further, in this implementation, residual movement resulting from deformation of one actuator may be compensated for by deformation of an orthogonal actuator to provide greater precision in the alignment of the microcomponent being held by holder 201 with the target position (●) For instance, actuator 207 can be controllably deformed to move holder 201 in the +Y direction to compensate for the residual movement in the −Y direction caused by deformation of actuator 205.

FIG. 3 shows an exemplary implementation of a further embodiment of the present invention. In the embodiment of FIG. 3, positioning device 300 is shown, which allows for movement in both the ±X and ±Y directions. More specifically, microcomponent positioning device 300 includes microcomponent holder 201, actuator pairs 203 and 204, flexures 205C–208C, and electrical connectors 209A–209D and 210, which are arranged as described above in FIG. 2. Essentially, exemplary positioning device 300 of FIG. 3 comprises four of the actuator arrangements described above in FIG. 1, each arranged at 90 degrees relative to one another. The exemplary implementation of FIG. 3 enables even greater precision in the positioning of a microcomponent than in the examples provided in FIGS. 1 and 2. For example, while the exemplary implementations of FIGS. 1 and 2 may enable positioning of a microcomponent within approximately 500 nanometers (or less) of a target position, the implementation of FIG. 3 may enable positioning of a microcomponent within approximately 100 nanometers (or less). Such greater precision is achieved in the implementation of FIG. 3 because it does not produce the residual movement along an orthogonal axis, as described above with the implementations of FIGS. 1 and 2.

In addition to the arrangement described above with FIG. 2, the implementation of positioning device 300 further includes actuator pair 303 operable to provide movement of holder 201 in the ±X direction, and actuator pair 304 operable to provide movement of holder 201 in the ±Y direction. As shown, actuator pair 303 includes actuators 305 and 306. Actuator 305 includes hot arm 305A and flexure 305B, and actuator 306 includes hot arm 306A and flexure 306B. As further shown, actuator pair 304 includes actuators 307 and 308. Actuator 307 includes hot arm 307A and flexure 307B, and actuator 308 includes hot arm 308A and flexure 308B. Additionally, electrical contacts 309A–309D and 310A–310C are included to power actuators 305–308. Also, flexures 305C and 306C couple actuators 305 and 306, respectively, to holder 201, and flexures 307C and 308C couple actuators 307 and 308, respectively, to holder 201.

As an example of operation of device 300, suppose again that a user desires to precisely position an optical fiber (e.g., to align the optical fiber with a receiver or transmitter); the fiber may be held by holder 201 in any suitable manner, such as those described above in conjunction with holder 201 of FIG. 2. Operational voltage may then be applied to at least one of electrical connections 209A–209D and/or at least one of electrical connections 309A–309D to trigger at least one of actuators 205–208 and 305–308 to move holder 201 (and therefore move the fiber being held by holder 201). As actuators 205–208 and 305–308 are activated, flexures 205C–208C and 305C–308C flex to enable movement of holder 201 responsive to such actuators 205–208 and 305–308.

Actuators 205–208 and 305–308 may initially be used to move holder 201 in a manner to determine a desired target position for the fiber. For instance, the fiber may be moved in the ±X and/or the ±Y directions until a desired target position is determined (e.g., a position that provides a desired alignment of the fiber with another device, such as an optical detector or a light source). Various techniques for determining a target position may be utilized, as described above with FIG. 2.

Once the target position is determined, at least one of actuators 205–208 and 305–308 may be controllably deformed to fix the position of the fiber to the target position. That is, at least one of actuators 205–208 and 305–308 may be controllably deformed to bring the position of the fiber into alignment with the target position. For example, suppose the fiber is positioned in the center of aperture 202, as indicated by an asterisk (*). Further suppose that a desired target position for the fiber is determined to be located in the +X and +Y direction from the fiber's initial position (*); such target position being indicated in FIG. 3 by a dot (●). It may be desirable to have the fiber's position fixed at the target position (●).

In this embodiment, opposing microactuators (i.e., microactuators arranged on opposite sides of holder 201) are controllably deformed in a like manner, which reduces/eliminates residual orthogonal movement of holder 201 that is described in the example of FIG. 1. That is, by arranging microactuators on opposing sides of holder 201, such microactuators may be controllably deformed in a manner that reduces/eliminates residual orthogonal movement of holder 201 to provide even greater precision. In the example of FIG. 3, voltage pulses may be applied between electrical pads 209B and 210 to electrothermally heat hot arm 205A of actuator 205, and voltage pulses may be applied in a like manner between electrical pads 309A and 310A to eletrothermally heat hot arm 306A of the opposing actuator 306. In this manner, opposing microactuators 205 and 306 may be controllably deformed in a like manner. More specifically, microactuators 205 and 306 may each be controllably deformed to cause holder 201 to be moved in the +X direction.

Because the opposing microactuators 205 and 306 are both deformed approximately the same amount, holder 201 is moved relatively straight along the X axis with minimal residual movement along the orthogonal Y axis. That is, opposing actuators 205 and 306 work together to effectively cancel out the residual motion in the orthogonal Y direction. For example, actuator 205 is deformed to produce movement of holder 201 in the +X direction. Operating alone it also produces residual movement of holder 201 in the −Y direction. Opposing actuator 306 is also arranged to produce movement of holder 201 in the +X direction when deformed. When operating alone, actuator 306 produces residual movement of holder 201 in the +Y direction. Thus, when the two opposing actuators 205 and 306 are both used (e.g., both controllably deformed a similar amount), the −Y residual movement caused by actuator 205 is cancelled out by the +Y residual movement caused by actuator 306, resulting in precise movement of holder 201 along the X axis.

Similarly, voltage pulses may be applied between electrical pads 209D and 210 to electrothermally heat hot arm 207A of actuator 207, and voltage pulses may be applied in a like manner between electrical pads 309C and 310B to eletrothermally heat hot arm 308A of the opposing actuator 308. In this manner, opposing microactuators 207 and 308 may be controllably deformed in a like manner. More specifically, microactuators 207 and 308 may each be controllably deformed to cause holder 201 to be moved in the +Y direction without incurring residual movement of holder 201 along the orthogonal X axis.

Once the above-described deformation process is complete, the power-off position of holder 201 (and the fiber being held thereby) may be fixed with great precision. For instance, implementations of this embodiment may enable positioning of a microcomponent being held by holder 201 within 100 nanometers (or less) of the target position (●). In view of the above, the exemplary implementation of FIG. 3 enables movement of holder 201 in two opposite directions along each of two orthogonal axes (i.e., in the ±X directions and the ±Y directions), and the range of movement along each of the two axes (X and Y axes) according to at least one implementation may be approximately 10 µm. As described above, the additional actuator pairs 303 and 304 provided in the example of FIG. 3 allows movement that may be achieved along the X and Y axes to be decoupled. That is, pairs 303 and 203 enable movement of holder 201 in the ±X directions without residual movement along the orthogonal Y axis. Similarly, actuator pairs 204 and 304 enable movement of holder 201 in the ±Y directions without residual movement along the orthogonal X axis.

Figure 4:
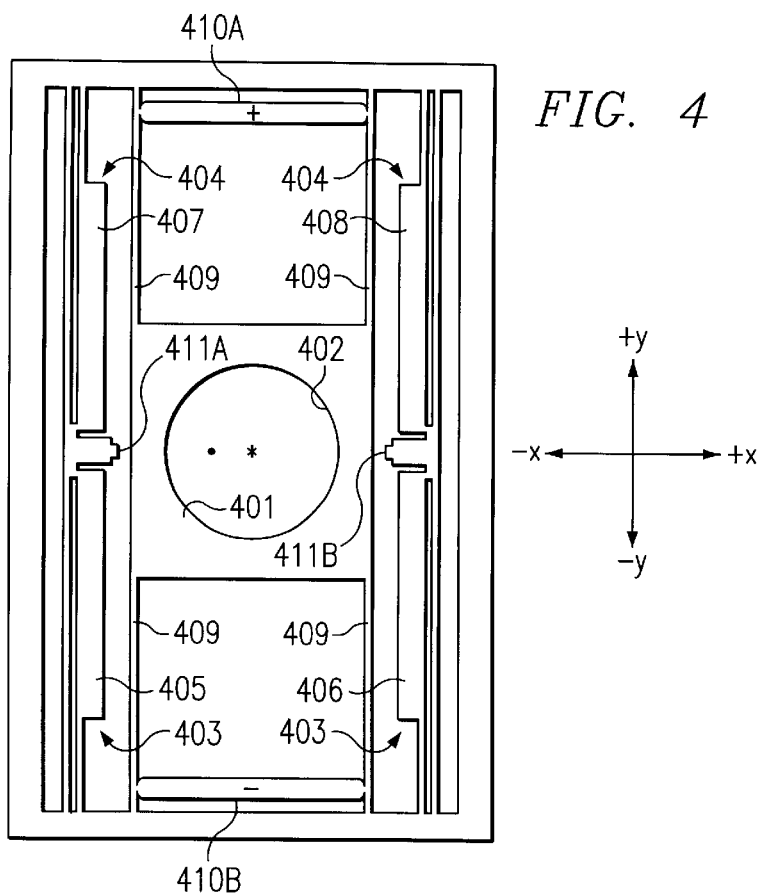
FIG. 4 shows an exemplary implementation of a positioning device in accordance with a second embodiment of the present invention.

FIGS. 1–3 described above provide exemplary implementations of microcomponent positioning devices in accordance with embodiments of the present invention that enable a microcomponent to be fixed to a target position by controllably deforming microactuators included within such microcomponent positioning devices. According to other embodiments of the present invention, a portion of the microcomponent device other than (or in addition to) the microactuators may be controllably deformed to perform precise positioning of a microcomponent. One exemplary implementation of such an embodiment of the present invention is shown in FIG. 4. In the embodiment of FIG. 4, microcomponent positioning device 400 is shown, which allows for movement in the ±X directions. Positioning device 400 includes microcomponent holder 401 (or "holding compartment" 401) that is operable to hold a microcomponent to be positioned in the manner described above with FIG. 1 for holder 101. As with microcomponent holder 101 of FIG. 1, microcomponent holder 401 may hold an optical fiber, other optical component, or any other microcomponent to be positioned. In this implementation, microcomponent holder 401 includes aperture 402, in which a microcomponent may be inserted.

Positioning device 400 further includes actuator pairs 403 and 404 operable to provide movement of holder 401 in the ±X directions. As shown, actuator pair 403 includes actuators 405 and 406, and actuator pair 404 includes actuators 407 and 408. Electrical contacts (not shown) are included to power actuators 405–408. Positioning device 400 further includes support members 409 (which may be referred to herein as support beams or deformation members), which are coupled to (and/or support) holder 401. In this embodiment, support members 409 are coupled to electrical connectors 410A and 410B, and such electrical connectors may be utilized to electrothermally heat support members 409. Once support members 409 are sufficiently heated (such that they are malleable), actuators 405–408 may be utilized to apply force for moving microcomponent holder 401 in the ±X direction, causing support members 409 to deform in a manner to allow such movement. Once a target position is achieved, support members 409 may be allowed to cool (e.g., by terminating power being supplied by electrical connectors 410A and 410B) to fix holder 401 to such target position. Support members 409 may comprise such materials as conductive plastic, silicon, polysilicon, or nickel, as examples. Support members 409 are preferably of a material (that cools back to room temperature very quickly), (e.g. in a few milliseconds to a few seconds), such as conductive plastic, silicon, polysilicon, or nickel, as examples.

As an example of operation of device 400, suppose again that a user desires to precisely position an optical fiber (e.g., to align the optical fiber with a receiver or transmitter); the fiber may be held by holder 401 in any suitable manner, such as those described above in conjunction with holder 101. Deforming voltage may then be applied to at least one of electrical connections 410A–410B to electrothermally heat support members 409. Once support members 409 are sufficiently heated, at least one of actuators 405–408 may be triggered to move holder 401 (and therefore move the fiber being held by holder 401). For example, actuators 405 and/or 407 may move in the +X direction causing bumper 411A coupled thereto to engage holder 401 and apply a force against holder 401 in the +X direction. Similarly, actuators 406 and/or 408 may move in the –X direction causing bumper 411B coupled thereto to engage holder 401 and apply a force against holder 401 in the –X direction. Once support members 409 are sufficiently heated, they may deform (e.g., bend or flex) to enable holder 401 to be moved in the ±X direction responsive to force applied thereto by actuators 405–408.

Actuators 405–408 may initially move holder 401 in a manner to determine a desired target position for the fiber. For instance, the fiber may be moved in the ±X directions until a desired target position is determined (e.g., a position that provides a desired alignment of the fiber with another device, such as an optical detector or a light source). As described above, any suitable positioning algorithm for determining a target position may be utilized. In at least one implementation feedback may be used to aid in determining the optimal position.

Once the target position is achieved, at least one of actuators 405–408 may apply a force against holder 401 to maintain holder 401 at the target position, and support members 409 may be allowed to cool/harden, thereby fixing holder 401 at the target position. That is, power being applied to support members 409 may be terminated, thus enabling such support members to cool and harden to fix the position of holder 401 to the target position. Power being applied to the actuators 405–408 may then be terminated, and the holder 401 may maintain the target position without requiring power for maintaining such position.

Accordingly, in this embodiment, support members 409 may be controllably deformed to bring the position of the fiber into alignment with the target position. For example, suppose the fiber is positioned in the center of aperture 402, as indicated by an asterisk (*). Further suppose that a desired target position for the fiber is determined to be located in the –X direction from the fiber's initial position (*); such target position being indicated in FIG. 4 by a dot (●). It may be desirable to have the fiber's position fixed at the target position (●). In this embodiment, support members 409 are heated (e.g., electrothermally heated), and actuators 405–408 may be utilized to move holder 401 in the –X direction to the target position (●). By moving holder 401 while support members 409 are sufficiently heated (such that they are malleable), support members 409 are controllably deformed. Once the target position (●) is achieved for the fiber, support members 409 are allowed to cool/harden, thereby fixing the position of the fiber to the target position (●). Thus, when power is turned off to actuators 405–408, support arms 409 have been deformed such that the power-off position of holder 401 (and the fiber being held thereby) is moved in the –X direction.

In view of the above, the exemplary implementation of FIG. 4 enables movement of holder 401 in two opposite directions along one axis (i.e., in the ±X directions), and the range of movement along the X axis according to at least one implementation may be approximately 10 $\mu$m. Of course, other ranges of movement may be provided in other implementations thereof. While exemplary device 400 includes two pairs of actuators (pairs 403 and 404), in alternative implementations device 400 may include only one of pairs 403 and 404. However, such an implementation may result in slight bending in the Y direction as described with the exemplary implementation of FIG. 1 above. Further, actuators may only be necessary on one side of holder 401 to provide movement along the X axis. For instance, in certain implementations only actuator 405 and/or 407 may be utilized to provide movement in the +X direction. However, it is preferable to have actuators on opposite sides of holder 401 to enable movement in both the +X and –X directions.

Electrothermal heating of microstructures (or Joules heating), such as beams, for re-shaping (e.g., deformation) is known in the art. As one example, Yang and Fujita describe use of Joules heating re-shaping single-crystal silicon microstructures for fabricating 3D microstructures (See "Reshaping of Single Crystal Silicon Microstructures," Japanese Journal of Applied Physics, Part 1, Vol. 38, No. 3A, pp. 1580–1583, 1999, the disclosure of which is hereby incorporated herein by reference). As another example, Fukuta, et al. describe use of Joule heating for re-shaping polysilicon structures in "A Reshaping technology with Joule Heat for Three-Dimension polysilicon Structures" Proc. 8$^{th}$ Int. Conf. On Solid State Sensor and Actuator, Stockholm, Sweden, p. 174 (1995), the disclosure of which is hereby incorporated herein by reference. As yet another example, Fukuta, et al. describe use of Joule heating of a polysilicon beam for plastic deformation thereof to enable self-assembly of a microcomponent with 3D shape in "Microactuated Self-Assembling of 3D Polysilicon Structures with Reshaping Technology," Proc. IEEE Micro Electro Mechanical System, MEMS 97, pp. 477–481 (1997), the disclosure of which is hereby incorporated herein by reference.

The above references fail to teach a structure for holding and positioning a microcomponent through use of deformation (or re-shaping) of such structure. For example, Fukuta, et al. teach utilizing reshaping technology to enable self-assembly of a 3D micro-structure. The micro-structure taught by Fukuta et al. includes a plate, polysilicon beam, and Scratch Drive Actuator (SDA), which are fabricated in the plane of the substrate. Joule heating is then utilized to heat the polysilicon beam, and the SDA is activated to apply a force against the polysilicon beam, causing the beam to buckle (or bend). As the beam bends, it lifts the plate off of the substrate, resulting in a 3D micro-structure. Fukuta et al. fails to teach a structure for holding and positioning a microcomponent. Further, Fukuta et al. fails to teach controllably deforming the structure to achieve a desired position of a microcomponent being held by such structure (e.g., to align the microcomponent with another device).

Figure 5:
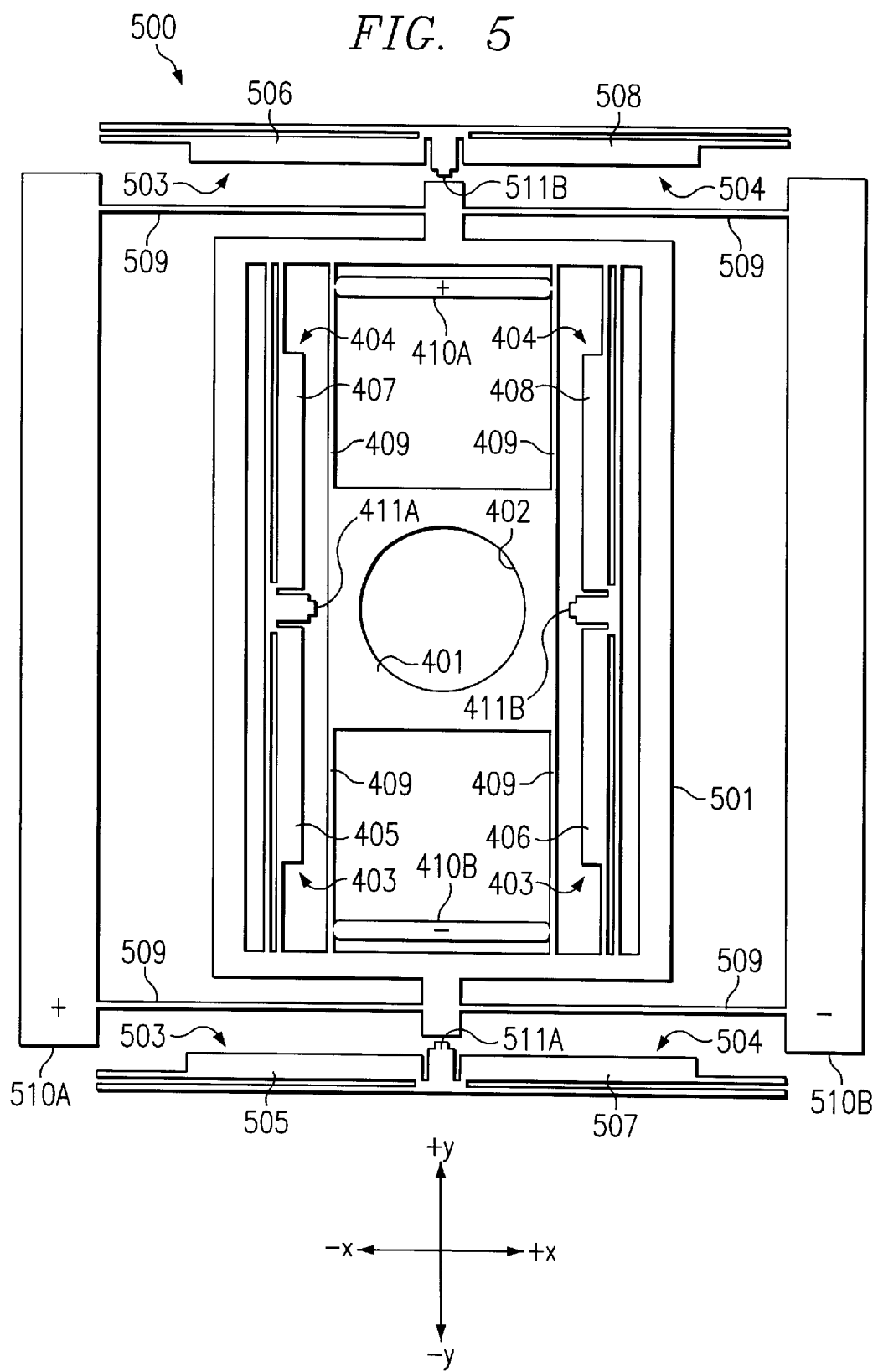
FIG. 5 shows another exemplary implementation of a positioning device in accordance with a second embodiment of the present invention.

Turning now to FIG. 5, an exemplary implementation of a further embodiment of the present invention is shown. In the embodiment of FIG. 5, positioning device 500 is shown, which allows for movement in both the X and Y directions. More specifically, microcomponent positioning device 500 includes microcomponent holder 401, actuator pairs 403 and 404, support members 409, and electrical connectors 410A and 410B, which are arranged as described above in FIG. 4. In this example, the configuration described above with FIG. 4, which allows for positioning of holder 401 in the ±X directions, is implemented within compartment (or frame) 501. Positioning device 500 further comprises actuator pairs 503 and 504. Actuator pair 503 includes actuators 505 and 506, and actuator pair 504 includes actuators 507 and 508. As shown actuators 505–508 are arranged at 90 degrees relative to actuators 405–408.

Positioning device 500 further includes support members 509 (which may be referred to herein as support beams or deformation members), which are coupled to (and/or support) compartment 501. In this embodiment, support members 509 are coupled to electrical connectors 510A and 510B, and such electrical connectors may be utilized to heat (e.g., electrothermally heat) support members 509. Once support members 509 are sufficiently heated, actuators 505–508 may be utilized to apply force for moving compartment 501 in the ±Y direction causing support members 509 to deform in a manner to allow such movement. Once a target position is achieved, support members 509 may be allowed to cool (e.g., by terminating power being supplied by electrical connectors 510A and 510B) to fix holder 401 to such target position. Support members 509 may be formed of similar material as described above for support members 409, and support members 509 preferably cool relatively quickly (e.g., in a few milliseconds to a few seconds).

As an example of operation of device 500, suppose again that a user desires to precisely position an optical fiber (e.g., to align the optical fiber with a receiver or transmitter); the fiber may be held by holder 401 in any suitable manner, such as those described above in conjunction with holder 101. Deforming voltage may then be applied to at least one of electrical connections 410A–410B to electrothermally heat support members 409, and deforming voltage may also be applied to at least one of electrical connections 510A–510B to electrothermally heat support members 509. Once support members 409 and 509 are sufficiently heated, at least one of actuators 405–408 and 505–508 may be triggered to move holder 401 (and therefore move the fiber being held by holder 401). For example, actuators 405 and/or 407 may move in the +X direction causing bumper 411A coupled thereto to engage holder 401 and apply a force against holder 401 in the +X direction. Similarly, actuators 406 and/or 408 may move in the −X direction causing bumper 411B coupled thereto to engage holder 401 and apply a force against holder 401 in the −X direction.

Also, actuators 505 and/or 507 may move in the +Y direction causing bumper 511A coupled thereto to engage compartment 501 and apply a force against compartment 501 in the +Y direction, thereby effectively moving compartment 501 and holder 401 contained therein in the +Y direction. Similarly, actuators 506 and/or 508 may move in the −X direction causing bumper 511B coupled thereto to engage compartment 501 and apply a force against compartment 501 in the −X direction, thereby effectively moving compartment 501 and holder 401 contained therein in the −Y direction. Once support members 409 and 509 are sufficiently heated (such that they are malleable), they may deform (e.g., bend or flex) to enable holder 401 to be moved in the ±X and ±Y directions responsive to force applied by actuators 405–408 and 505–508.

Actuators 405–408 and 505–508 may initially move holder 401 in a manner to determine a desired target position for the fiber. For instance, the fiber may be moved in the ±X and ±Y directions until a desired target position is determined (e.g., a position that provides a desired alignment of the fiber with another device, such as an optical detector or a light source). As described above, any suitable positioning algorithm (e.g., hill climbing algorithm) for determining a target position may be utilized. In at least one implementation feedback may be used to aid in determining the optimal position.

Once the target position is achieved, at least one of actuators 405–408 and 505–508 may apply a force to maintain holder 401 in the target position, and support members 409 and 509 may be allowed to cool/harden, thereby fixing holder 401 in the target position. That is, power being applied to heat support members 409 and 509 may be terminated, thus enabling such support members to cool and harden to fix the position of holder 401 to the target position. Operational power being applied to the actuators 405–408 and 505–508 may then be terminated, and the holder 401 may maintain the target position without requiring power for maintaining such position. While exemplary device 500 includes two pairs of actuators for movement in the Y direction (pairs 503 and 504 ), in alternative implementations device 500 may include only one of pairs 503 and 504. However, such an implementation may result in slight residual movement in the X direction as described above.

Figure 6:
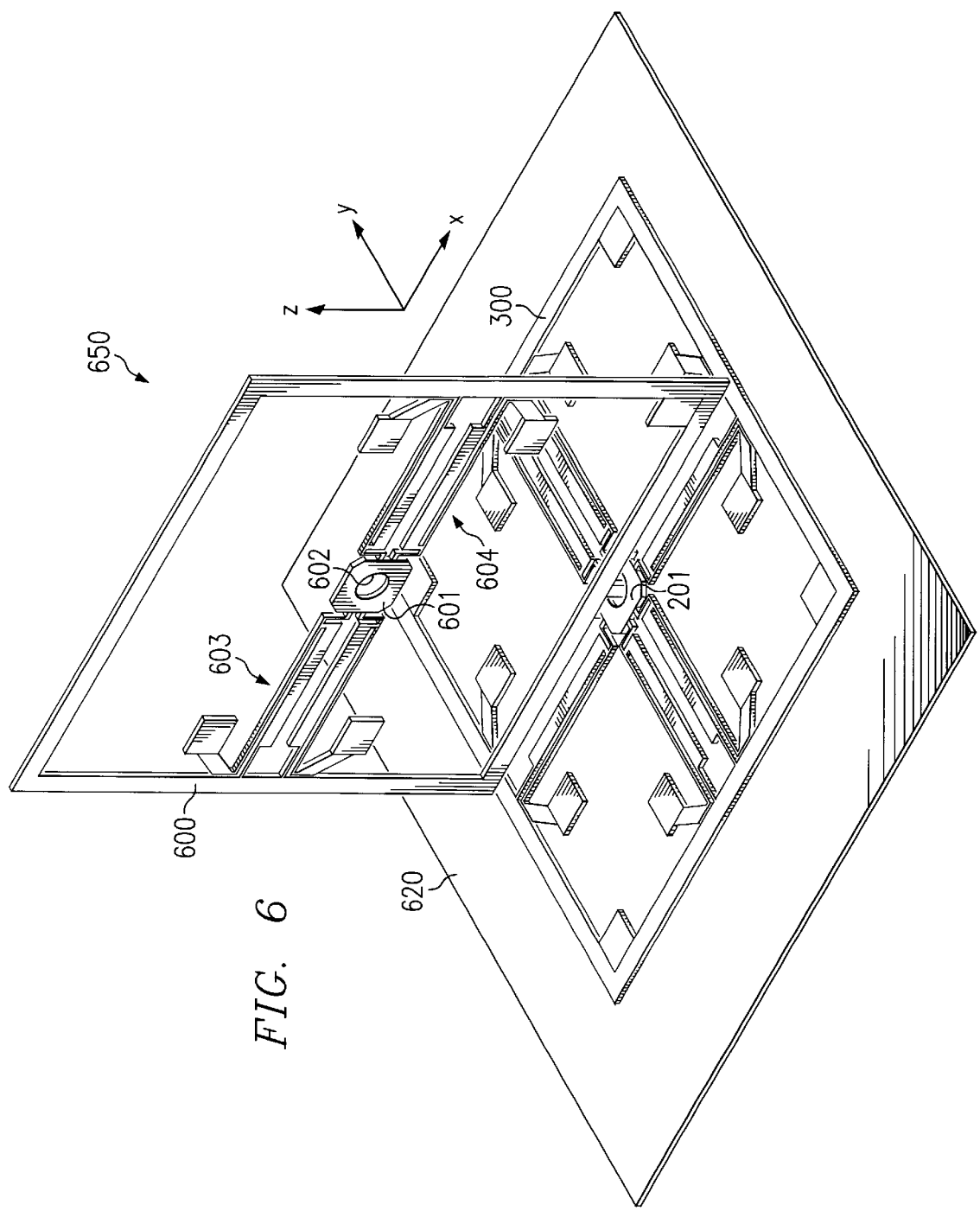
FIG. 6 shows an exemplary implementation of a positioning device that enables three degrees of freedom of movement.

Embodiments of the present invention may be implemented in the plane of a substrate (e.g., wafer) and/or such embodiments may be implemented out of the plane of a substrate (e.g., arranged orthogonal to the plane of the substrate). Furthermore, a plurality of positioning devices may be combined to provide for movement of a microcomponent along three orthogonal directional axes (X, Y, and Z). For example, an exemplary implementation of one embodiment of the present invention that enables movement of a microcomponent along three orthogonal directional axes X, Y, and Z is shown in FIG. 6. More specifically, a system is shown that comprises substrate 620. In this example, microcomponent positioning device 650 comprises positioning device 300 (as described above in FIG. 3), which is implemented in the plane of substrate 620 to provide positional movement of a microcomponent held by holder 201 in the ±X and ±Y directions. Also, in this example, a microcomponent positioning device 600 is provided, which includes an extension protruding therefrom that is held by holder 201. Microcomponent positioning device 600 is similar to positioning device 300 of FIG. 3, and is implemented to include two opposing pairs of microactuators 603 and 604. Positioning device 600 provides positional movement to a microcomponent held by holder 601 (e.g., in aperture 602) in the ±Z directions.

Microcomponent positioning device 650 of FIG. 6 enables precise positioning of a microcomponent in three-dimensions. For instance, microcomponent positioning device 650 may enable positioning a microcomponent being held in holder 601 to within 100 nanometers or less of a target position. The actuators of microcomponent positioning device 300 and microcomponent positioning device 600 may first be operated to determine a desired target position for the microcomponent being held by holder 601 (e.g., in accordance with a hill climbing algorithm, feedback, et cetera). Once a target position is determined for proper alignment of the microcomponent being held by holder 601 (e.g., an optical fiber), the appropriate actuators of microcomponent positioning device 650 may be controllably deformed in the manner described above in conjunction with FIGS. 1–3 to effectively fix the position of the microcomponent being held by holder 601 to the target position. As further described above, the microactuators of positioning device 650 may be deformed to accurately position a microcomponent to a target position with no power applied to such actuators. That is, after the deformation process is complete, the power-off position of such actuators is such that they fix the position of the microcomponent held by holder 601 to the target position.

Figure 7:
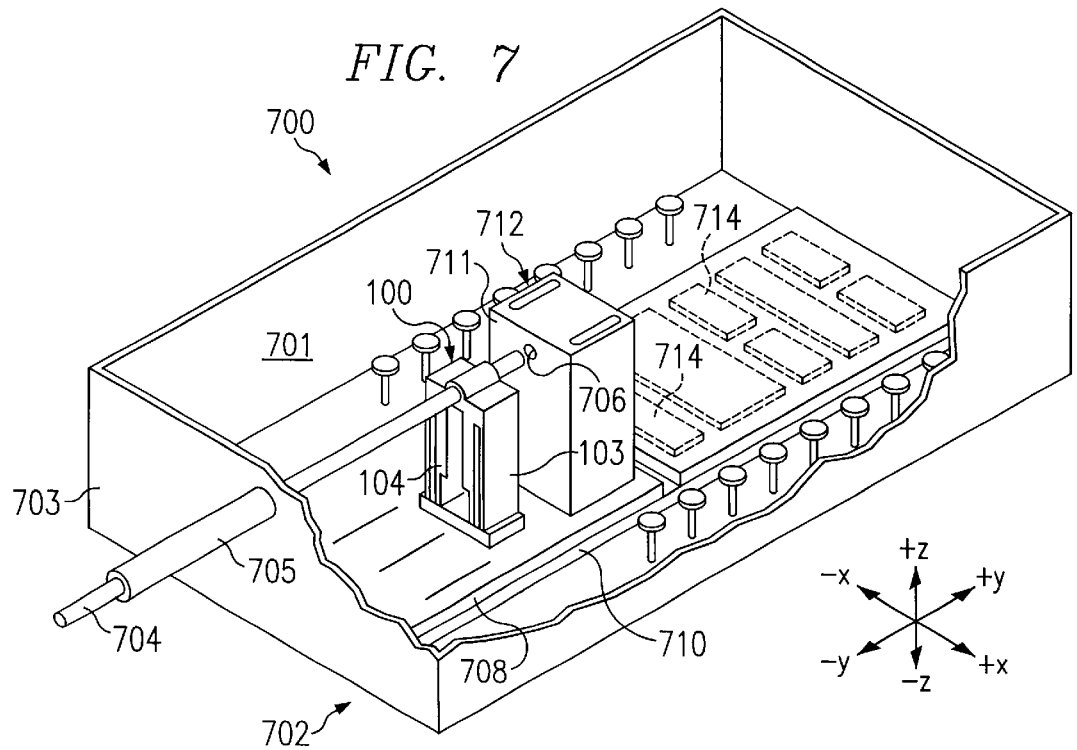
FIG. 7 shows an exemplary application of an embodiment of the present invention within an optoelectronic device.

Turning to FIG. 7 an exemplary application of an embodiment of the present invention within an optoelectronic device 700 is shown. More specifically, in this example, device 700 comprises an optoelectronic hybrid package, such as an optical receiver or optical transmitter, having an optical interface that utilizes an embodiment of the present invention. Exemplary device 700 includes an enclosure 701 having sidewalls 703; a header assembly 702, and a device floor 710. A substrate 708 is mounted on the device floor 710. In this example, substrate 708 provides a base for microcomponent positioning device (or "align-and-fix device") 100, which is described more fully in FIG. 1. Also in this example, a block 712 is mounted to substrate 708, and block 712 has optoelectronic component 706 coupled thereto on side 711. As examples, optoelectronic component 706 may comprise a light source (e.g., a LED or laser diode) when device 700 is an optical transmitter, and optoelectronic component 706 may comprise a light detector (e.g., a PIN photodiode) when device 700 is an optical receiver. Device 700 may further comprise electrical circuitry 714.

A cylindrical hermetic feedthrough 705 leads to an aperture formed in sidewall 703, which may be substantially aligned with optoelectronic component 706. Hermetic feedthrough 705 may, for example, comprise a KOVAR tube with a gold-plated interior that is braised to sidewall 703. U.S. Pat. No. 5,692,086 discloses an exemplary hermetic feedthrough that may be implemented as hermetic feedthrough 705. Optical fiber 704 extends through hermetic feedthrough 705 into the interior of device 700. Optical fiber 704 may be any type of optical fiber, such as commercially available sleeved gold metallized optical fiber commonly used for fiber optic communications. Thus, optical fiber 704 may comprise a light-guiding core and a sleeve (not shown in FIG. 7), which is preferably a high-temperature plastic that is physically and chemically stable over a wide temperature range.

As further shown in the example of FIG. 7, microcomponent positioning device 100 is included, which holds optical fiber 704 (e.g., in the manner described more fully in conjunction with FIG. 1). Of course, in alternative implementations, any of the embodiments of the present invention may be utilized within device 700 for aligning and fixing the position of optical fiber 704. Positioning device 100 is operable to position optical fiber 704 with great precision. That is, positioning device 100 may be utilized to accurately align optical fiber 704 with optoelectronic component 706. Once a target position is determined for proper alignment of optical fiber 704, the actuators 103 and/or 104 of positioning device 100 may controllably deformed in the manner described in conjunction with FIG. 1 to effectively fix the position of optical fiber 704 to a target position (e.g., a position that is sufficiently aligned with optoelectronic component 706). As further described above, actuators 103 and/or 104 may be deformed to accurately position optical fiber 704 to a target position with no power applied to such actuators. Thus, actuators 103 and/or 104 may be controllably deformed to fix the position of optical fiber 704 to a target position with no power being required to be supplied to positioning device 100 in order for it to maintain such fixed position of optical fiber 704.

Figure 8:
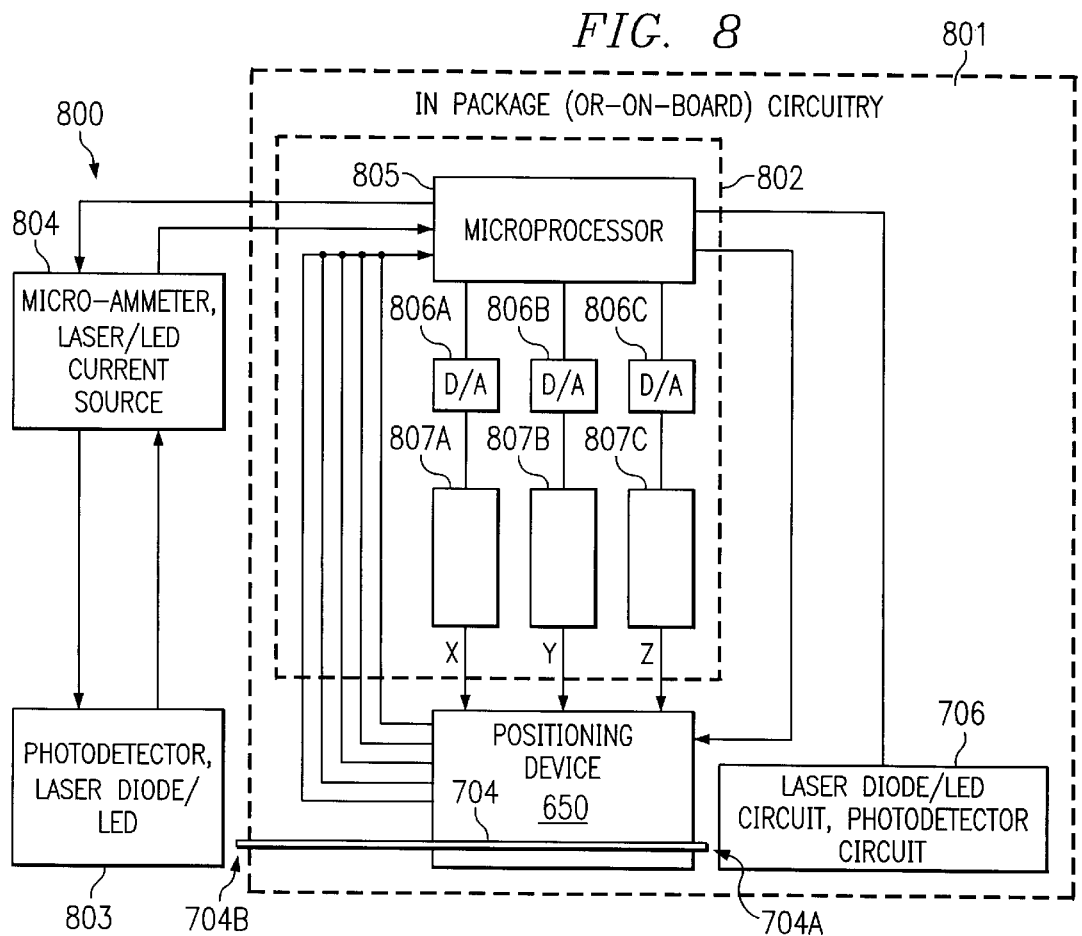
FIG. 8 shows an exemplary feedback implementation that may be utilized with embodiments of the present invention.

A feedback technique, such as any technique now known or later discovered, may be initially utilized by the positioning device to determine a target position for optical fiber 704 (e.g., a position at which optical fiber 704 is optimally aligned with optoelectronic component 706). FIG. 8 shows an exemplary feedback system that may be utilized for determining a target position for optical fiber 704. More specifically, in this example, feedback is used to determine a target position at which optical fiber 704 is suitably aligned with optoelectronic component 706. In the example of FIG. 8, positioning device 650 described above with FIG. 6 is implemented for positioning optical fiber 704, rather than positioning device 100 (shown in FIG. 7). As described with FIG. 6 above, positioning device 650 enables three degrees of positional freedom (i.e., allows movement along the X, Y, and Z axes).

The exemplary feedback implementation of FIG. 8 includes components arranged internally (801) within an optoelectronic device and further includes external circuitry 800. In this example, photodetector 803 and micro-ammeter 804 are provided for measuring an optical signal transmitted from optoelectronic component 706 (e.g., a LED or laser diode) into optical fiber 704. Photodetector 803 is optically coupled to end 704B of optical fiber 704, which is opposite end 704A of optical fiber 704 that receives input light from optoelectronic component 706. The output of photodetector 803 is input to micro-ammeter 804, which produces output representative of the light signal received by photodetector 803.

Control circuitry 802 may be arranged internal to an optoelectronic device in some implementations and may be arranged external to an optoelectronic device in other implementations. Control circuitry 802 comprises microprocessor 805, digital-to-analog (D/A) converters 806A–806C, and current sources 807A–807B, which may be coupled to the appropriate electrical connectors for powering the actuators of positioning device 650. It should be understood that in certain embodiments, additional current sources controllable by microprocessor 805 may be included for electrothermally heating support members of a positioning device, such as described with the exemplary implementations of FIGS. 4 and 5 above. Microprocessor 805 receives output from micro-ammeter 804 in digital form. Microprocessor 805 may process the received light measurement information and sends appropriate commands to one or more of the microactuators of positioning device 650 via D/A converters 806A–806C and corresponding current sources 807A–807C to direct the X, Y, and/or Z directional movement of optical fiber 704 by positioning device 650. Microprocessor 805 may control positioning device 650 to move optical fiber 704 to various positions (e.g., in accordance with an algorithm, such as a hill climbing algorithm) to search for the target position (e.g., the position at which optical fiber 704 is optimally aligned with optoelectronic component 706).

Once the target position is determined, microprocessor 805 may control current sources 807A–807C to controllably deform one or more of the actuators of positioning device 650 to effectively fix the power-off position of optical fiber 704 (i.e., the position of optical fiber 704 when no power is applied to positioning device 650) to be aligned with the target position (e.g., optimally aligned with optoelectronic component 706) with great precision. That is, microprocessor 805 may control current sources 807A–807C to electrothermally heat the hot arms of the actuators to fix the position of the optical fiber to the target position.

In alternative embodiments, hot arms of an actuator (such as in the embodiments of FIGS. 1–3 and 6) or support members (such as in the embodiments of FIGS. 4 and 5) may be heated by a technique other than electrothermal heating. For instance, a laser may be included in certain embodiments for heating an actuator's hot arm and/or support members of a microcomponent positioning device. In such embodiments, microprocessor 805 may control the laser for heating the part(s) of the microcomponent positioning device for deformation thereof. Various other methods now known or later discovered for controllably heating such actuator arms and/or support members may be utilized in embodiments of the present invention.

Figure 9:
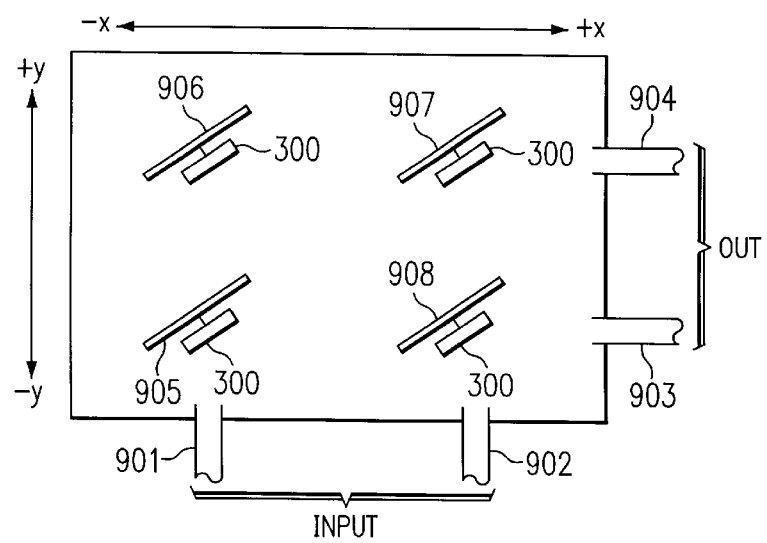
FIG. 9 shows an exemplary application of an embodiment of the present invention within another optoelectronic device.

While various examples have been described herein for positioning an optical fiber, it should be recognized that embodiments of the present invention are not limited to positioning optical fibers. For example, any optical microcomponent may be positioned with embodiments of the present invention. For instance, FIG. 9 provides a further exemplary application of an embodiment of the present invention within an exemplary optical device 900. Optical device 900 receives two input fibers 901 and 902 and has two output fibers 903 and 904. Micro-mirrors 905–908 are included within device 900 to redirect the path of an optical signal in the manner well known in the optical communication arts. Micro-mirrors 905–908 may be caused to lay flat such that optical signals received into device 900 from fibers 901 and 902 pass over such micro-mirrors 905–908 (i.e., without micro-mirrors 905–908 altering with the propagation path of such optical signals). Additionally, micro-mirrors 905–908 may be individually controlled to flip up into the path of an optical signal, thereby redirecting such optical signal to one of output fibers 903 and 904. An example of such flip-up micro-mirrors 905–908 is further described by J. Robert Reid, Victor M. Bright, and J. T. Butler in "Automated assembly of flip-up micromirrors," Sensors and Actuators A 66 (1998), pages 292–298. Accordingly, it should be understood that optical signals received via input fibers 901 and 902 may be controllably directed to either of output fibers 903 and 904. For instance, an optical signal received via input fiber 901 may be directed toward output fiber 903 if micro-mirror 905 is activated (caused to flip up to redirect the path of such optical signal), or the optical signal received via input fiber 901 may be directed toward output fiber 904 if micro-mirror 905 remains flat and micro-mirror 906 redirects the path of the optical signal. Similarly, an optical signal received via input fiber 902 may be directed toward output fiber 903 if micro-mirror 907 is activated (caused to flip up to redirect the path of such optical signal), or the optical signal received via input fiber 902 may be directed toward output fiber 904 if micro-mirror 907 remains flat and micro-mirror 908 redirects the path of the optical signal.

A potential problem that may be encountered with such a configuration as that of FIG. 9 is achieving proper alignment of micro-mirrors 905–908 with input fibers 901 and 902 and/or with output fibers 903 and 904 such that they properly redirect received optical signals to the appropriate output fiber 903 or 904. As the example of FIG. 9 illustrates, embodiments of the present invention may be utilized for properly positioning micro-mirrors 905–908. More specifically, in the example of FIG. 9, microcomponent positioning devices 300, which are described above with FIG. 3, are implemented holding micro-mirrors 905–908. Of course, other implementations of microcomponent positioning devices of the present invention may be utilized, such as any of the exemplary implementations of FIG. 1–2 and 4–6. Accordingly, each of positioning devices 300 may have one or more of its microactuators (not shown in FIG. 9) controllably deformed to fix the position of its respective micro-mirror (along the X and Y axes of FIG. 9) to a position that properly aligns the micro-mirror for receiving an input signal from one of input fibers 901 and 902 and redirecting such signal to one of output fibers 903 and 904 (e.g., with minimal signal loss).

While various optical applications have been described above, it should be recognized that embodiments of the present invention are not limited to application within the field of optics, but may be utilized in any type of application in which precise positioning of microcomponents is desired (e.g., for alignment with another device). A further example of an application of embodiments of the present invention is for assembly of microcomponent devices (e.g., microassembly of MEMs or other devices having microcomponents assembled therein. For instance, embodiments of the present invention may position microcomponents either permanently or temporarily, which may aid in an assembly process. For example, holder 101 of positioning device 100 may hold a microcomponent, and positioning device 100 may execute to fix the position of the microcomponent to a target position (e.g., aligned with another microcomponent). An assembly operation may be performed on the microcomponent, and holder 101 may be designed to then release the microcomponent.

Embodiments of the present invention may be implemented within a device, such as an optoelectronic device to enable changes in positioning of microcomponents included within such device to be performed in the field. Thus, if microcomponents become mispositioned (e.g., misaligned)

after the device has been deployed, embodiments of the present invention may be implemented to enable positional correction in the field. Also, embodiments of the present invention may be utilized at the time of manufacturing. Further, embodiments of the present invention enable re-positioning of a microcomponent. For instance, a microcomponent's position may be fixed (via controlled deformation of the positioning device), and the microcomponent's position may later be altered and re-fixed to a new position (via controlled deformation of the positioning device).

Various techniques may be utilized for fabricating positioning devices in accordance with embodiments of the present invention are known. Examples of fabrication techniques that may be utilized for fabricating implementations of such positioning devices are further disclosed in co-pending U.S. patent application Ser. No. 09/569,330 entitled "METHOD AND SYSTEM FOR SELF-REPLICATING MANUFACTURING STATIONS" filed May 11, 2000 and co-pending U.S. patent application Ser. No. 09/616,500 entitled "SYSTEM AND METHOD FOR CONSTRAINING TOTALLY RELEASED MICROCOMPONENTS" filed Jul. 14, 2000, the disclosures of which have been incorporated herein by reference. Further examples of fabrication techniques that may be utilized are disclosed in U.S. Pat. No. 4,740,410 issued to Muller et al. entitled "MICROMECHANICAL ELEMENTS AND METHODS FOR THEIR FABRICATION," U.S. Pat. No. 5,660,680 issued to Chris Keller entitled "METHOD FOR FABRICATION OF HIGH VERTICAL ASPECT RATIO THIN FILM STRUCTURES," and U.S. Pat. No. 5,645,684 issued to Chris Keller entitled "MULTILAYER HIGH VERTICAL ASPECT RATIO THIN FILM STRUCTURES."

Embodiments of the present invention may be monolithically produced. That is, positioning devices according to embodiments of the present invention may be produced through use of a single fabrication process. Accordingly, the time and/or complexity associated with fabricating a microcomponent positioning device may be reduced. Preferably, the fabrication process utilized enables certain parts of the microcomponent positioning device to be electrically insulated from other parts of such microcomponent positioning device. As an example, the fabrication techniques described more fully in co-pending U.S. patent application Ser. No. 09/569,330 entitled "METHOD AND SYSTEM FOR SELF-REPLICATING MANUFACTURING STATIONS" filed May 11, 2000 and co-pending U.S. patent application Ser. No. 09/616,500 entitled "SYSTEM AND METHOD FOR CONSTRAINING TOTALLY RELEASED MICROCOMPONENTS" filed Jul. 14, 2000 enable such electrical insulation of parts of a fabricated microcomponent. Thus, for instance, in the exemplary implementation of FIG. 5, support members 409 and 509 may be electrically insulated from each other such that each of support members 409 and 509 may be individually electrothermally heated.

Given that the microcomponent positioning devices of embodiments of the present invention are themselves microcomponents, such positioning devices provide a space-efficient positioning mechanism that may be implemented within devices. That is, microcomponent positioning devices of embodiments of the present invention may be implemented within a device without consuming much space therein, thus allowing a compact design of the device and/or allowing greater space for other components to be arranged within the device. For example, the exemplary implementation of microcomponent positioning device 100 described in conjunction with FIG. 1 may be implemented having a size of approximately 0.5 mm (along the X axis) by approximately 1.25 mm (along the Y axis). As another example, the exemplary implementations of microcomponent positioning devices 200 and 300 described in conjunction with FIGS. 2 and 3, respectively, may each be implemented having a size of approximately 2.5 mm by approximately 2.5 mm. Of course, microcomponent positioning devices of the present invention may be implemented having smaller or larger size than the specific examples provided herein.

While the above examples describe electrothermally heating portions of a positioning device (e.g., support beams and/or actuators) for deformation of such portions, various other methods of heating the portions of a positioning device may be utilized in alternative embodiments. For example, a laser may be utilized to heat such portions of a positioning device in alternative embodiments. Also, it should be understood that the microcomponent holder of a positioning device may securely hold a microcomponent for positioning thereof in various manners. According to one implementation, epoxy may be utilized to secure the microcomponent within the holder, such as within aperture 102 of holder 101 (FIG. 1). According to another implementation, the holder may be operable to collapse against a microcomponent to securely hold it therein. As still another implementation, a microcomponent may include a coupling mechanism for being coupled to the holder of a positioning device, such as the coupling mechanisms disclosed in co-pending U.S. patent application Ser. No. 09/570,170 entitled "SYSTEM AND METHOD FOR COUPLING MICROCOMPONENTS" and co-pending U.S. patent application Ser. No. 09/643,011 entitled "SYSTEM AND METHOD FOR COUPLING MICROCOMPONENTS UTILIZING A PRESSURE FITTING RECEPTACLE," the disclosures of which have been incorporated herein by reference.

According to at least one embodiment of the present invention, a microcomponent positioning device may be utilized to fix the position of a microcomponent held thereby with great precision. For instance, in at least one embodiment a microcomponent's position may be fixed to within approximately 500 nanometers (or less) of a target position. Further, in at least one embodiment, a microcomponent's position may be fixed to within approximately 100 nanometers (or less) of a target position.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of positioning a microcomponent comprising the steps of:
   receiving into a microcomponent positioning device a microcomponent at an initial position;
   activating at least one microactuator of said microcomponent positioning device;
   determining a target position for said microcomponent; and moving said microcomponent to said target position by controllably deforming at least a portion of said microcomponent positioning device to cause movement of said microcomponent in a positive axial direction and a negative axial direction along a first axis with respect to said initial position, and to accurately fix, at least temporarily, the position of said microcomponent at said target position.

2. The method of claim 1 wherein said controllably deforming step further comprises the step of:
   heating said at least a portion of said microcomponent positioning device.

3. The method of claim 2 wherein said heating step further comprises:
   heating said at least a portion of said microcomponent positioning device to a sufficiently high temperature to make said at least a portion of said microcomponent positioning device amenable to alteration of its shape.

4. The method of claim 3 wherein said at least a portion of said microcomponent positioning device comprises at least one material selected from the group consisting of:
   plastic, silicon, polysilicon, and nickel.

5. The method of claim 2 wherein said controllably deforming step further comprises the step of:
   allowing said at least a portion of said microcomponent positioning device to cool.

6. The method of claim 5 wherein said heating step comprises heating said at least a portion of said microcomponent positioning device to a sufficiently high temperature to make said at least a portion of said microcomponent positioning device amenable to alteration of its shape, and wherein once said at least a portion of said microcomponent positioning device cools, it resumes being unamenable to alteration of its shape.

7. The method of claim 2 wherein said heating step further comprises:
   electrothermally heating said at least a portion of said microcomponent positioning device.

8. The method of claim 2 wherein said heating step further comprises:
   using a laser to heat said at least a portion of said microcomponent positioning device.

9. The method of claim 1 wherein said at least a portion of said microcomponent positioning device comprises said at least one microactuator.

10. The method of claim 9 wherein said controllably deforming step further comprises the step of:
    electrothermally heating said at least one microactuator.

11. The method of claim 1 wherein said at least one microactuator is operable to move said microcomponent.

12. The method of claim 1 wherein said movement of said microcomponent along said first axis is enabled by an arrangement of said at least one microactuator.

13. The method of claim 1 wherein said moving of said microcomponent to said target position further comprises controllably deforming at last a portion of said microcomponent positioning device to cause movement of said microcomponent in a direction selected from the group consisting of a positive axial direction along a second axis orthogonal to said first axis, and a negative axial direction along said second axis, wherein said at least one microactuator includes microactuators arranged to provide said movement along said second axis.

14. The method of claim 13 wherein said moving of said microcomponent to said target position further comprises controllably deforming at least a portion of said microcomponent positioning device to cause movement of said microcomponent in a direction selected from the croup consisting of a positive axial direction along a third axis orthogonal to said first axis and to said second axis, and a negative axial direction along said third axis, wherein said at least one microactuator includes microactuators arranged to provide said movement along said third axis.

15. The method of claim 1 wherein said microcomponent positioning device comprises a holding compartment for holding said microcomponent and one or more support beams supporting said holding compartment, and wherein said controllably deforming step further comprises the step of:
    controllably deforming at least one of said one or more support beams.

16. The method of claim 15 wherein said controllably deforming step further comprises the step of:
    electrothermally heating said at least one of said one or more support beams.

17. The method of claim 1 wherein said target position is a position at which said microcomponent is sufficiently aligned with another device.

18. The method of claim 17 wherein said microcomponent comprises an optical fiber.

19. The method of claim 18 wherein said another device comprises an optoelectronic device.

20. The method of claim 19 wherein said optoelectronic device is selected from the group consisting of:
    an optical receiver and an optical transmitter.

21. The method of claim 1 wherein said microcomponent positioning device is monolithically fabricated.

22. The method of claim 1 further comprising the step of:
    monolithically fabricating said microcomponent positioning device.

23. The method of claim 1 wherein said activating step is performed to move said microcomponent until said target position is determined.

24. The method of claim 23 wherein said determining step further comprises:
    evaluating feedback received from a feedback system to determine said target position.

25. The method of claim 23 further comprising the step of:
    deactivating said at least one microactuator, wherein said controllably deforming step maintains the position of said microcomponent at said target position.

26. The method of claim 1 wherein said controllably deforming step fixes said position of said microcomponent within 500 nanometers of said target position.

27. The method of claim 1 wherein said controllably deforming step fixes said position of said microcomponent within 100 nanometers of said target position.

28. A microcomponent positioning device comprising:
    a microcomponent holder operable to receive a microcomponent therein at an initial position;
    at least one microactuator operable to apply a force to move said microcomponent holder in a positive axial direction and a negative axial direction along a first axis with respect to said initial position; and at least one portion that is controllably deformable to enable said microcomponent holder to be moved responsive to said force to accurately fix, at least temporarily, the position of said microcomponent at a determined target position.

29. The microcomponent positioning device of claim 28 wherein said device is monolithically fabricated.

30. The microcomponent positioning device of claim 29 comprising at least one part that is electrically insulated from at least one other part.

31. The microcomponent positioning device of claim 28 wherein said at least one portion is said at least one microactuator.

32. The microcomponent positioning device of claim 28 wherein said at least one portion comprises at least one support beam arranged for supporting said microcomponent holder.

33. The microcomponent positioning device of claim 28 wherein said at least one microactuator comprises:

at least two opposing microactuators arranged on opposite sides of said microcomponent holder.

34. The microcomponent positioning device of claim 28 wherein said at least one microactuator comprises:

at least one pair of microactuators.

35. The microcomponent positioning device of claim 28 wherein said at least one microactuator comprises:

at least two microactuators arranged at 90 degrees to each other.

36. The microcomponent positioning device of claim 28 wherein said at least one microactuator comprises:

at least two pairs of microactuators, wherein each pair is arranged at 90 degrees relative to the other pair.

37. The microcomponent positioning device of claim 28 wherein said at least one microactuator comprises:

at least four microactuators each arranged at 90 degrees to at least one other of said at least four microactuators.

38. The microcomponent positioning device of claim 28 wherein said at least one microactuator comprises:

at least four pairs of microactuators, wherein each pair is arranged at 90 degrees relative to at least one other of said at least four pairs of microactuators.

39. The microcomponent positioning device of claim 28 wherein said at least one microactuator comprises:

at least six microactuators each arranged at 90 degrees to at least one other of said at least six microactuators.

40. The microcomponent positioning device of claim 28 wherein said at least one microactuator comprises:

at least six pairs of microactuators, wherein each pair is arranged at 90 degrees relative to at least one other of said at least six pairs of microactuators.

41. The microcomponent positioning device of claim 28 wherein said at least one microactuator includes microactuators operable to apply a force to move said microcomponent holder in a direction selected from the group consisting of a positive axial direction along second axis orthogonal to said first axis, and a negative axial direction along said second axis.

42. The microcomponent positioning device of claim 41 wherein said at least one microactuator includes microactuators operable to apply a force to move said microcomponent holder in a direction selected from the group consisting of a positive axial direction along a third axis orthogonal to said first axis and to said second axis, and a negative axial direction along said third axis.

43. A method of positioning a microcomponent comprising the steps of:

receiving into a microcomponent positioning device a microcomponent at an initial position, wherein said microcomponent positioning device comprises at least one microactuator;

activating said at least one microactuator to move said microcomponent in a positive axial direction and a negative axial direction along a first axis with respect to said initial position to determine a target position; and controllably deforming at least a portion of said microcomponent positioning device to accurately fix, at least temporarily, the position of said microcomponent at said target position.

44. The method of claim 43 further comprising the step of:

deactivating said at least one microactuator, wherein said controllably deforming step maintains the position of said microcomponent at said target position.

45. The method of claim 43 wherein said at least a portion of sold microcomponent positioning device comprises said at least one microactuator.

46. The method of claim 43 wherein said at least a portion of said microcomponent positioning device comprises at least one support beam that is arranged to support a microcomponent holder of said microcomponent positioning device.

47. The method of claim 43 wherein said activating stop further comprises:

causing said at least one microactuator to move said microcomponent in accordance with a search algorithm to determine said target position.

48. The method of claim 43 further comprising the steps of:

receiving feedback, wherein said activating step further comprises causing said at least one microactuator to move said microcomponent responsive to said feedback.

49. The method of claim 43 wherein said controllably deforming step further comprises the step of:

heating said at least a portion of said microcomponent positioning device.

50. The method of claim 49 wherein said heating step further comprises:

heating said at least a portion of said microcomponent positioning device to a sufficiently high temperature to make said at least a portion of said microcomponent positioning device amenable to alteration of its shape.

51. The method of claim 50 wherein said at least a portion of said microcomponent positioning device comprises at least one material selected from the group consisting of:

plastic, silicon, polysilicon, and nickel.

52. The method of claim 49 wherein said controllably deforming step further comprises the step of:

allowing said at least a portion of said microcomponent positioning device to cool.

53. The method of claim 52 wherein said heating step comprises heating said at least a portion of said microcomponent positioning device to a sufficiently high temperature to make said at least a portion of said microcomponent positioning device amenable to alteration of its shape, and wherein once said at least a portion of said microcomponent positioning device cools, it resumes being unamenable to alteration of its shape.

54. The method of claim 49 wherein said heating step further comprises:

electrothermally heating said at least a portion of said microcomponent positioning device.

55. The method of claim 49 wherein said heating step further comprises:

using a laser to heat said at least a portion of said microcomponent positioning device.

56. The method of claim 43 wherein said activating said at least one microactuator further comprises moving said microcomponent in a direction selected from the group consisting of a positive axial direction along a second axis orthogonal to said first axis, and a negative axial direction along said second axis, wherein said at least one microactuator includes microactuators arranged to provide said movement along said second axis.

57. The method of claim 56 wherein said activating said at least one microactuator further comprises moving said microcomponent in a direction selected from the group consisting of a positive axial direction along a third axis orthogonal to said first axis and to said second axis, and a negative axial direction alone said third axis, wherein said at least one microactuator includes microactuators arranged to provide said movement along said third axis.

58. The method of claim 43 wherein said microcomponent positioning device is monolithically fabricated.

59. The method of claim 43 wherein said controllably deforming step comprises:

controllably deforming said at least one portion to move said microcomponent in a first direction selected from the group consisting of a positive axial direction and a negative axial direction along a first axis with respect to said initial position, and a second direction selected from the group consisting of a positive axial direction along a second axis orthogonal to said first axis and a negative axial direction along said second axis, to achieve said target position.

60. The method of claim 59 wherein said controllably deforming step further comprises:

controllably deforming said at least one portion to move said microcomponent in a third direction selected from the group consisting of a positive axial direction along a third axis orthogonal to said first axis and to said second axis and a negative direction along said third axis to achieve said target position.

61. The method of claim 43 wherein said controllably deforming step fixes said position of said microcomponent within 500 nanometers of said target position.

62. The method of claim 43 wherein said controllably deforming step fixes said position of said microcomponent within 100 nanometers of said target position.

63. A system for positioning a microcomponent comprising:

micro-means for holding the microcomponent at an initial position;

micro-means for generating movement of the holding means in a positive axial direction and a negative axial direction along a first axis with respect to said initial position; and controllably deformable micro-means for accurately fixing, at least temporarily, said holding means such that said microcomponent is positioned at a target position.

64. The system of claim 63 further comprising:

means for determining said target position.

65. The system of claim 64 wherein said determining means comprises a feedback system.

66. The system of claim 63 wherein said micro-means for generating movement of the holding means comprises at least one microactuator.

67. The system of claim 63 wherein said controllably deformable micro-means comprises said micro-means for generating movement of the holding means.

68. The system of claim 63 wherein said controllably deformable micro-means is deformable to accurately fix, at least temporarily, said holding means such that said microcomponent is positioned at said target position without requiring electrical power for fixing said holding means.

69. The system of claim 63 wherein said micro-means further generate movement of said holding means in a direction selected from the group consisting of a positive axial direction along a second axis orthogonal to said first axis, and a negative axial direction along said second axis.

70. The system of claim 69 wherein said micro-means further generate movement of said holding means in a direction selected from the group consisting of a positive axial direction along a third axis orthogonal to said first axis and to said second axis, and a negative axial direction along said third axis.

* * * * *

UNITED STATES PATENT AND TRADEMARK OFFICE
CERTIFICATE OF CORRECTION

PATENT NO.    : 6,678,458 B2
DATED         : January 13, 2004
INVENTOR(S)   : Ellis et al.

It is certified that error appears in the above-identified patent and that said Letters Patent is hereby corrected as shown below:

<u>Title page,</u>
Item [73], Assignee, change
"[73] Assignee: Zynex Corporation, Richardson, TX (US)" to
-- [73] Assignee: Zyvex Corporation, Richardson, TX (US) --

<u>Column 23,</u>
Line 9, after "and" insert a paragraph break.

<u>Column 24,</u>
Line 11, change "croup" to -- group --.

<u>Column 26,</u>
Line 18, change "sold" to -- said --.
Line 25, change "stop" to -- step --.

<u>Column 27,</u>
Line 18, change "alone" to -- along --.

Signed and Sealed this

Fifteenth Day of June, 2004

JON W. DUDAS
*Acting Director of the United States Patent and Trademark Office*